United States Patent [19]
Paz de Araujo et al.

[11] Patent Number: 6,110,531
[45] Date of Patent: *Aug. 29, 2000

[54] METHOD AND APPARATUS FOR PREPARING INTEGRATED CIRCUIT THIN FILMS BY CHEMICAL VAPOR DEPOSITION

[75] Inventors: Carlos A. Paz de Araujo; Larry D. McMillan; Narayan Solayappan; Jeffrey W. Bacon, all of Colorado Springs, Colo.

[73] Assignee: Symetrix Corporation, Colorado Springs, Colo.

[*] Notice: This patent issued on a continued prosecution application filed under 37 CFR 1.53(d), and is subject to the twenty year patent term provisions of 35 U.S.C. 154(a)(2).

[21] Appl. No.: 08/892,485

[22] Filed: Jul. 14, 1997

Related U.S. Application Data

[63] Continuation-in-part of application No. 08/653,079, May 21, 1996, abandoned, and a continuation-in-part of application No. 08/090,767, Jul. 12, 1993, Pat. No. 5,648,114, and a continuation-in-part of application No. 08/480,477, Jun. 7, 1995, Pat. No. 5,688,565, which is a continuation-in-part of application No. 08/154,927, Nov. 18, 1993, Pat. No. 5,519, 234, which is a division of application No. 07/965,190, Oct. 23, 1992, abandoned, which is a continuation-in-part of application No. 07/807,439, Dec. 13, 1991, abandoned, said application No. 08/480,477, and a continuation-in-part of application No. 07/993,380, Dec. 18, 1992, Pat. No. 5,456, 945, which is a continuation-in-part of application No. 07/660,428, Feb. 25, 1991, abandoned, which is a continuation-in-part of application No. 07/690,940, Jun. 17, 1991, Pat. No. 5,138,520.

[51] Int. Cl.$^7$ .......................... C23C 16/40; C23C 16/18; H01L 21/31
[52] U.S. Cl. ............................... 427/255.25; 427/255.32; 427/255.36; 427/255.19; 438/778; 438/785; 438/758
[58] Field of Search .................... 427/561, 565, 427/564, 562, 576, 569, 255.1, 255.2, 255.3, 422, 255.19, 255.25, 255.29, 255.31, 255.32, 255.36; 438/778, 785, 758

[56] References Cited

U.S. PATENT DOCUMENTS

| | | | |
|---|---|---|---|
| 3,608,821 | 9/1971 | Simm et al. | 239/3 |
| 3,658,304 | 4/1972 | Hall, Jr. et al. | 427/255 |
| 4,263,335 | 4/1981 | Wagner et al. | 427/29 |
| 4,748,043 | 5/1988 | Seaver et al. | 427/30 |
| 4,792,463 | 12/1988 | Okada et al. | 427/126.3 |
| 4,965,090 | 10/1990 | Gartner et al. | 427/39 |

(List continued on next page.)

FOREIGN PATENT DOCUMENTS

| | | | |
|---|---|---|---|
| 0 548 990 A2 | 6/1993 | European Pat. Off. | C23C 16/44 |
| 0 736 613 A1 | 10/1996 | European Pat. Off. | C23C 16/44 |
| WO 87/07848 | 12/1987 | WIPO | B01D 1/16 |
| WO 89/07667 | 8/1989 | WIPO | C23C 16/40 |

OTHER PUBLICATIONS

Chen et al, *j. MaterChem*, 6 (5) p. 765–771 "Morphology Central of thin LiCoO$_2$ films fabrications . . . ", 1996 no month.

Day et al, eds; The 8$^{th}$ Internet, Sympos. on Integral Ferroelectric Tempe, AZ. USA.—Reprints p. 229–235, Mar. 18–20, 1996.

(List continued on next page.)

*Primary Examiner*—Marianne Padgett
*Attorney, Agent, or Firm*—Duft, Graziano & Forest, P.C.

[57] ABSTRACT

A mist is generated by a venturi from liquid precursors containing compounds used in chemical vapor deposition, transported in carrier gas through tubing at ambient temperature, passed into a heated zone where the mist droplets are gasified at a temperature of between 100° C. and 200° C., which is lower than the decomposition temperature of the precursor compounds. The gasified liquid is injected through an inlet assembly into a deposition reactor in which there is a substrate heated to from 400° C. to 600° C., on which the gasified compounds decompose and form a thin film of layered superlattice compound.

31 Claims, 8 Drawing Sheets

U.S. PATENT DOCUMENTS

| | | | |
|---|---|---|---|
| 4,993,361 | 2/1991 | Unvala | 118/723 |
| 5,120,703 | 6/1992 | Snyder et al. | 427/561 |
| 5,138,520 | 8/1992 | McMillan et al. | 361/311 |
| 5,204,314 | 4/1993 | Kirlin et al. | 505/1 |
| 5,229,171 | 7/1993 | Donovan et al. | 427/483 |
| 5,238,709 | 8/1993 | Wilkie | 427/475 |
| 5,250,383 | 10/1993 | Naruse | 430/131 |
| 5,258,204 | 11/1993 | Wernberg et al. | 427/255 |
| 5,262,396 | 11/1993 | Yamazaki | 505/1 |
| 5,278,138 | 1/1994 | Ott et al. | 505/1 |
| 5,316,579 | 5/1994 | McMillan et al. | 118/50 |
| 5,316,800 | 5/1994 | Noakes et al. | 427/466 |
| 5,344,676 | 9/1994 | Kim et al. | 427/468 |
| 5,372,754 | 12/1994 | Ono | 261/142 |
| 5,399,388 | 3/1995 | Aklufi | 427/565 |
| 5,401,680 | 3/1995 | Abt et al. | 437/52 |
| 5,423,285 | 6/1995 | Paz de Araujo et al. | 117/90 |
| 5,439,845 | 8/1995 | Watanabe et al. | 437/130 |
| 5,456,945 | 10/1995 | McMillan et al. | 427/252 |
| 5,468,679 | 11/1995 | Paz de Araujo et al. | 437/110 |
| 5,478,610 | 12/1995 | Desu et al. | 427/573 |
| 5,519,234 | 5/1996 | Paz de Araujo et al. | 257/295 |
| 5,534,309 | 7/1996 | Liu | 427/458 |
| 5,540,959 | 7/1996 | Wang | 427/561 |
| 5,595,606 | 1/1997 | Fujikawa et al. | 118/725 |
| 5,614,252 | 3/1997 | McMillan et al. | 427/99 |
| 5,863,619 | 6/1999 | Hur | 427/562 |
| 5,888,583 | 3/1999 | McMillan et al. | 427/96 |

OTHER PUBLICATIONS

Katayama et al.; Growth and Properties of $PbTiO_3$ Thin Films by Photoenhanced Chemical Vapor Deposition; Japanese Journal of Applied Physics; vol. 30, No. 9B; Sep., 1991; pp. 2189–2192.

Katayama et al.; "Photo–MOCVD of $PbTiO_3$ thin films"; Journal of Crystal Growth 115; 1991; pp. 289–293 no month.

Shimiizu et al.; "Preparation of $PbTiO_3$ Thin Films by Photo–MOCVD"; Department of Electronics, Faculty of Engineering; Kyoto University; Sep. 1992.

Nakamura et al.; "Preparation of $Bi_4Ti_3O_{12}$ Thin Film by MOCVD"; Proceedings of 10th Ferroelectric Materials and Their Applciations (May 24–May 28, 1993) in Japanese, can't read.

Smolenskii et al.; "Ferroelectrics and Related Materials"—"Oxygen–Octahedral Ferroelectrics"; pp. 690–703 no date.

Gopalakrishnan et al.; A Homologous Series of Recurrent Intergrowth Structures of the Type $Bi_4A_{m+n-2}B_{m+n}O_{3(m+n)+6}$ Formed by Oxides of the Aurivillius Family; Journal of Solid State Chemistry 55, pp. 101–105; 1984 no month.

Yamane et al.; Preparation of Bi–Sr–Ca–Cu–O Films by Chemical Vapor Depsotion with Metal Chelate and Alkoxide:; Chemistry Letters, pp. 1515–1516; 1988 no month.

Lathrop et al.; "Production of $Yba_2Cu_3O_{7-y}$ Superconducting Thin Films In Situ by High–Pressure Reactive Evaporation and Rapid Thermal Annealing"; Appl. Phys. Lett. 51 (19); Nov. 9, 1987; pp. 1554–1556 1/4 of $1^{st}$ page missing.

METHOD AND APPARATUS FOR PREPARING INTEGRATED CIRCUIT THIN FILMS BY CHEMICAL VAPOR DEPOSITION

This application is a continuation-in-part (CIP) of U.S. patent application Ser. No. 08/653,079 filed May 21, 1996, now abandon; and is also a CIP of U.S. Ser. No. 08/090,767, filed Jul. 12,1993, now U.S. Pat. No. 5,648,114 issued Jul. 15, 1997; and is also a CIP of U.S. Ser. No. 08/480,477 filed Jun. 7, 1995, now U.S. Pat. No. 5,688,565 issued Nov. 18, 1997, which is a CIP of U.S. Ser. No. 08/154,927 filed Nov. 18, 1993, now U.S. Pat. No. 5,519,234 issued May 21, 1996, which is a divisional of U.S. Ser. No. 07/965,190 filed Oct. 23, 1992, now abandon, which is a CIP of U.S. Ser. No. 07/807,439 filed Dec. 13, 1991, now abandon; additionally Ser. No. 08/480,477 (U.S. Pat. No. 5,688,565) is also a CIP of U.S. Ser. No. 07/993,380 filed Dec. 18, 1992, now U.S. Pat. No. 5,456,945 issued Oct. 10, 1995, which is a CIP of U.S. Ser. No. 07/660,428 filed Feb. 25, 1991, now abandon, which is a CIP of U.S. Ser. No. 07/690,940 filed Jun. 17, 1991, now U.S. Pat. No. 5,138,520 issued Aug. 11, 1992. Ser. No. 07/690,940 was based on PCT application Ser. No. 89/05882 filed on Dec. 27, 1989.

BACKGROUND OF THE INVENTION

1. Field of the Invention

The invention relates to methods for depositing high quality films of complex (compound) materials on substrates at high deposition rates, and apparatus for effecting such methods. Particularly, the invention relates to enhanced chemical vapor deposition from liquid sources depositing high quality thin films of a large variety of complex compounds at high deposition rates, and apparatus for effecting such methods. More particularly the invention relates to apparatus and processes for fabricating high quality thin films of layered superlattice compounds.

2. Statement of the Problem

There are known methods for depositing thin films of complex compounds, such as metal oxides, ferroelectrics, super-conductors, materials with high dielectric constants, gems, etc. Such known methods include RF sputtering, chemical vapor deposition (CVD), and spin coating. RF sputtering does not provide thin films of suitably high quality for practical integrated circuit uses, and it is hard if not impossible to control the stoichiometry so as to produce materials within the strict requirements of integrated circuit uses. Spin coating avoids the above defects of sputtering, but does not have good step coverage and suitably high fabrication rates for commercial uses. Present methods of chemical vapor deposition, while having good step coverage, are simply not able to form complex materials of suitable quality for integrated circuit use. The application of known CVD methods to complex materials, such as layered superlattice compounds, results in premature decomposition of the reagents and, often, a dry dust, rather than a solid material deposited on the substrate, or result in inferior quality materials that are not suitable for use as active components in an integrated circuit.

It has been recently discovered that certain layered compounds, referred to herein as layered superlattice compounds, are far better suited for use in ferroelectric and high dielectric constant memories than any prior art materials. These materials are highly complex, and no method is available to reliably fabricate high quality layered superlattice compounds in commercial quantities, at high deposition rates, and with step coverage that is suitable for making state-of-the-art integrated circuits.

3. Solution to the Problem

The invention solves the above problems by providing methods and apparatus for the chemical vapor deposition of thin films of layered superlattice materials that avoid premature decomposition of the reagents, provide easily controlled composition and flow rate of a gas phase reactant stream to the CVD reactor, and result in a thin film containing small grains having mixed orientation and good electrical properties.

One aspect of the invention is a two-step vaporization process, comprising production of a mist of each liquid precursor, followed by rapid, low-temperature vaporization of the mist.

Another aspect of the invention is the use of polyalkoxide precursors containing a plurality of chemical constituents of the desired thin film in order to reduce the total number of liquid precursors.

The invention is useful for fabrication of thin films of ceramics, glasseous materials, electrically-active materials, including ferroelectric materials and high dielectric constant materials from liquid sources including sol-gel or MOD formulations. The invention in particular provides a method of fabricating an integrated circuit having at least one layered superlattice thin film deposited by the CVD process. Preferably the integrated circuit is a non-volatile memory.

The invention provides a method of making CVD precursors utilizing methoxides, ethoxides, butoxides, propoxides and other compounds with which CVD precursors may be made for almost any layered superlattice material.

Preferably the invention uses a metal polyalkoxide reagent. Compared with other metalorganics used in CVD, the polyalkoxides have a high decomposition temperature.

Preferably there is only one metal oxide precursor and one polyalkoxide precursor. Preferably, the metal oxide precursor contains a bismuth-containing oxide that reacts with a double alkoxide precursor to produce a bismuth-layered superlattice. The preferred method provides for mixing all precursors used in the CVD process in a common solvent, such as tetrahydrofuran, prior to the misting step. In an alternative method, the invention provides for forming a mist of each liquid precursor separately, and then combining the separate mist streams for vaporization.

The invention provides an apparatus for forming a mist, preferably comprising a venturi-mister. The venturi-mister produces a mist of variable, controllable mass flow rates, comprising droplets of narrow, controllable size distribution. Because the mass flow rate and chemical composition of the mist is known, it is possible to deposit a thin film of uniform, desired composition and stoichiometry.

The invention provides for flowing the mist process streams through tubing at ambient temperature, thus avoiding premature decomposition of reagents at elevated temperature in the process tubing.

The invention provides for a heating zone in which the liquid reagents contained in the mist droplets in the flowing mist stream are gasified quickly at low temperature, i.e. before entering a deposition zone, thus avoiding premature decomposition at elevated temperature during gasification. This is possible because the droplets, being small, have a large surface to volume ratio and are moving at a finite velocity in the carrier gas through the heating zone. The resulting enhanced heat transfer rate enables the latent heat of vaporization necessary to gasify the liquid droplets in the mist to transfer to the liquid at a temperature below the ranges in which premature decomposition of the reagents could occur. Also, the misting and subsequent low-temperature gasification of precursor liquids enables the use of low-volatility reagent compounds, which otherwise would not be usable in a CVD process because of their low volatility.

The invention provides for decomposition of vaporized reagents and formation of the integrated circuit thin film, particularly a layered superlattice compound thin film, on a substrate in the deposition reactor at between 300° C. and 500° C. This produces an amorphous or polycrystalline phase with relatively small grain boundaries.

The invention provides for ion-coupled plasma (ICP) excitation of the reactant gas in the deposition reactor, which accelerates the rate of decomposition and reaction by overcoming kinetic barriers to reaction without adding heat to the reaction.

An alternative of the invention provides for a lead-containing organic precursor in order to produce a Pb-containing Bi-layered superlattice compound.

Another alternative provides for UV-irradiation of the reactant gas in the deposition reactor to enhance reagent decomposition and electronic properties of the deposited thin film.

The invention also optionally provides for an ion implantation step after the formation of the layered superlattice thin film and prior to the annealing step. This ion implantation step creates ion damage on the surface which provides a large number of crystallization nucleation points of different orientations.

The invention provides for a crystallization or recrystallization step after the thin film is formed in the CVD process. Preferably the thin film is crystallized or recrystallized in a furnace anneal at a temperature of from 400° C. to 900° C., preferably 750° C. A rapid thermal processing (RTP) anneal may also be used. In the RTP anneal the temperature is ramped over a range of from 1° C. per second to 300° C. per second and up to a temperature of from 500° C. to 850° C. for a holding period of from 5 seconds to 5 minutes.

The invention provides for depositing an electrode or contact on the material, such as a layered superlattice material, followed by a second anneal, preferably a furnace anneal at from 600° C. to 850° C. for a period of 15 minutes or more.

Preferably each of the heating steps, i.e. the CVD process, the first anneal and the second anneal after contact formation takes place at the same or a higher temperature than the preceding heating step.

Preferably the invention also includes a step of prebaking the substrate in an oxygen furnace at a temperature of between 500° C. and 1000° C. prior to performing the CVD deposition step.

The methods described above result in layered superlattice materials with good electronic properties, such as high polarizability, high dielectric constants, and low leakage currents. This is believed to be due to a crystalline orientation that results in good electronic properties.

DETAILED DESCRIPTION OF THE PREFERRED EMBODIMENT

Figure 1:
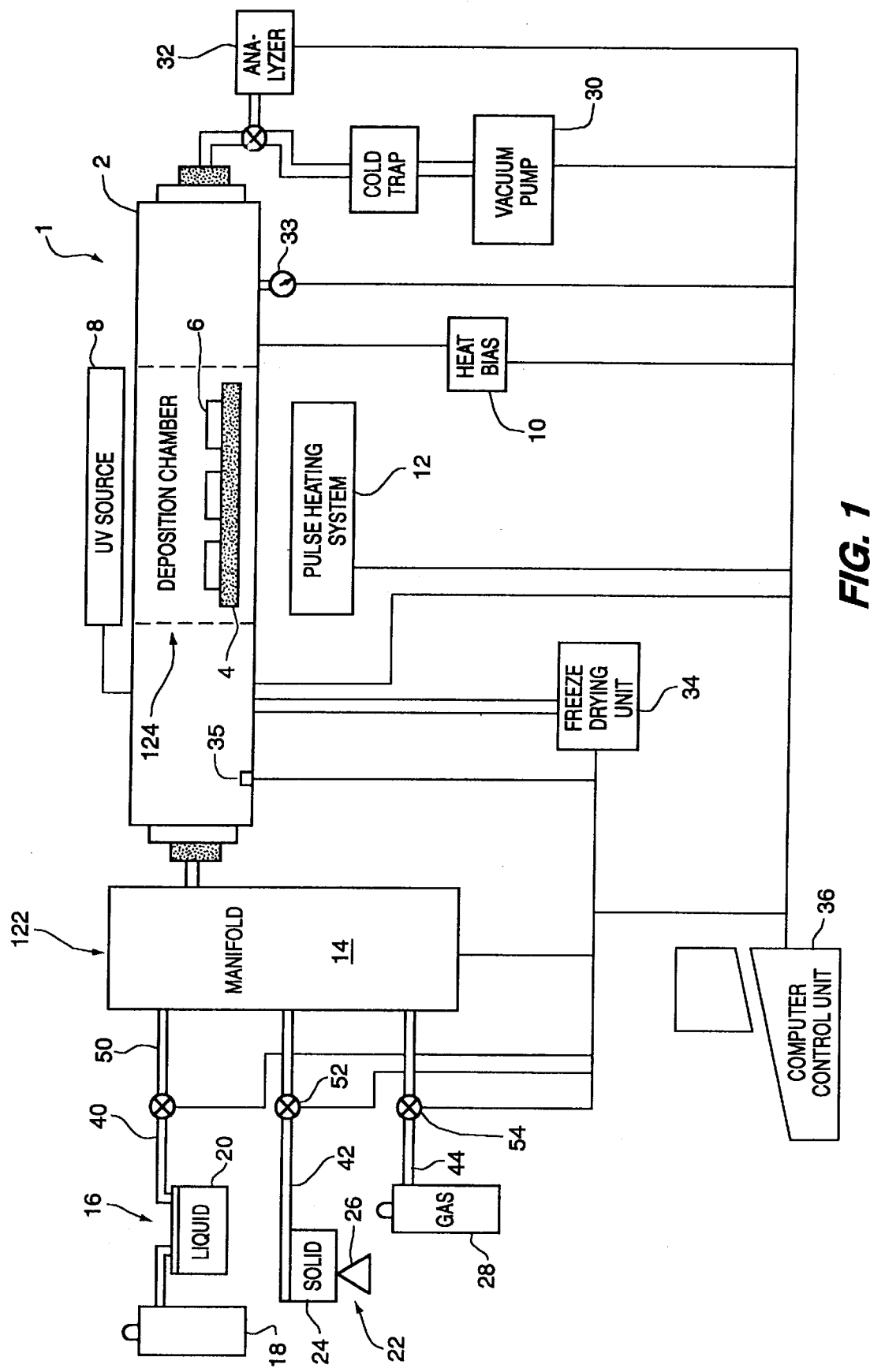
FIG. 1 is a schematic view of a CVD apparatus according to a first embodiment of the invention.

1. Overview and Description of the Apparatus

The term "thin film" herein means a thin film of a thickness appropriate to be used in an integrated circuit. Such thin films are less than 1 micron in thickness, and generally are in the range of 50 Å to 5000 Å. It is important to distinguish this term from the same term, i.e. "thin film" as used in essentially macroscopic arts, such as optics, where "thin film" means a film over 1 micron, and usually from 2 to 100 microns. Such macroscopic "thin films" are hundreds to thousands of times thicker than integrated circuit "thin films", and are made by entirely different processes that generally produce cracks, pores and other imperfections that would be ruinous to an integrated circuit, but are of no consequence in optics and other macroscopic arts.

The term "active" when applied to an electronic element in an integrated circuit, means an element that alters its state in response to some electrical stimulus. This is to distinguish elements that form important functions in the electrical circuit, and therefore must be of high, reproducible quality, and elements that are removed from the integrated circuit before its completion, which merely serve to separate portions of the circuit or act as a packaging element for the circuit, which elements do not need to be of nearly as high and reproducible quality.

The term "mist" as used herein is defined as fine drops or particles of a liquid and/or solid carried by a gas. The term "mist" includes an aerosol, which is generally defined as a colloidal suspension of solid or liquid particles in a gas. The term mist also includes a fog, as well as other nebulized suspensions of the precursor solution in a gas. Since the above terms and other terms that apply to suspensions in a gas have arisen from popular usage, the definitions are not precise, overlap, and may be used differently by different authors. In general, the term aerosol is intended to include all the suspensions included in the text *Aerosol Science and Technology*, by Parker C. Reist, McGraw-Hill, Inc., New York, 1983. The term "mist" as used herein is intended to be broader than the term aerosol, and includes suspensions that may not be included under the terms aerosol or fog. The term mist is to be distinguished from a gasified liquid, i.e. a gas.

The term "atomize" is used herein in its usual sense when applied to a liquid, which is to create a spray or mist, that is, to create a suspension of liquid droplets in a gas.

In common usage the term "vapor" can mean both a mist and a gas, and it is so used herein. The meaning can usually be determined by the context. For example, a vapor arising from ultrasonically vibrating a liquid is known in the art to be a mist, while a vapor arising from sublimating a solid source is known in the art to be a gas. A mist that is heated beyond the temperature at which the liquid gasifies is a gas or gaseous vapor. If the meaning can be ambiguous, we shall attempt to clarify by calling the gaseous form of the vapor a gaseous vapor.

FIG. 1 shows a first embodiment of a low pressure CVD apparatus according to the invention. Apparatus 1 includes a deposition chamber 2, a substrate holder 4 which supports one or more substrates 6, a vaporized source manifold 14 for introducing a vaporized source(s) into chamber 2, first, second and third means 8, 10, 12 for applying spectral energy and/or heat to chamber 2, liquid, solid, and gaseous feed units 16, 22, 28 for introducing vaporized compound sources into manifold 14, a vacuum pump 30 cooperating with chamber 2, an analyzer 32 for analyzing the composition of gases exhausted from chamber 2, pressure and temperature sensors 33, 35, and a computer control unit 36 to precisely control apparatus 1.

Units 16, 22, 28 generate and feed a vaporized source of at least one compound into manifold 14, which in turn feeds the vaporized source into chamber 2. Unit 16 includes at least one liquid source container 20 and at least one carrier gas source 18 which passes through the liquid source in container 20 to become saturated with the liquid source(s) and then fed into manifold 14 through tube 40. The carrier gas(es) may be inert or active and may contain a catalyst to increase the deposition rate.

Unit 22 includes at least one container 24 for containing at least one solid source, and means 26 which heats container 24 to vaporize the solid source, the vapors of which are then fed into manifold 14 through tube 42.

Unit 28 feeds at least one gaseous compound into manifold 14 through pipe 44.

Flow control valves 50, 52, 54, on the connector pipes 40, 42, 44, respectively, are controlled by unit 36 to precisely monitor and limit the flow rate of the vaporized sources into manifold 14 and chamber 2.

Not all of the units 16, 22, 28 will be used in every operation of apparatus 1, but rather one or more units 16, 22, 28 will be used to deposit a given thin film. More than one of each of units 16, 22, 28, can be used to feed a vaporized source into manifold 14 for any given thin film deposition.

The invention includes the feature of generating a stabilized liquid source, as for example by bubbling a carrier gas through a stabilized liquid source and/or atomizing the liquid source via an ultrasound cavity, with the gas passing through. The liquid source is introduced into an ultrasound cavity 20. The carrier gas passes through the cavity 20 and by ultrasonic vibration mixes with the liquid. The resulting heavily saturated (atomized) gas-liquid mixture is introduced into the deposition chamber 2 by way of a suitable nozzle. Injection of the gas-liquid mixture into the vacuum in the deposition chamber is controlled by such nozzle.

Changes in the composition of a thin film being deposited within chamber 2 are readily achieved by introducing different vaporized sources from units 16, 22, 28 through manifold 14 into chamber 2 in an automatic, computer-controlled manner. For example, the surface of the film can be tailored to achieve ohmic contacts and to reduce depolarization due to Schottky effects.

Although the use of stabilized sources is a preferred aspect, the invention is not so limited. Rather, other aspects, including the spectral energy and heating aspects discussed below, can be used in relation to vaporized sources which do react in chamber 2 before they are deposited on substrate 6. The liquid, solid and gaseous materials introduced by units 16, 22, 28 may be tuned for doping, for stoichiometric modifications and for the formation of other materials after they are vaporized and introduced into chamber 2.

Means 8,10,12 are preferably operated in combination in a predetermined manner by unit 36 to achieve a very high (precise) degree of control of the deposition of thin films. In general, means 8, 10, 12 are controlled such that the temperature within chamber 2 will gradually increase during the course of deposition.

Means 8 includes one or more units spaced about chamber 2, and is preferably a light source for applying a spectral energy bath to chamber 2 which "heats" the vaporized source within chamber 2 for dissociating a desired component(s) from the vaporized source to permit the components to be deposited on substrate 6. According to another preferred aspect, the bath applied by means 8 is tuned to optimize/maximize the dissociation of the desired component(s) from the vaporized source. Heat waves/radiant energy provided by means 8 will be controlled in a predetermined manner to correspond to the energy needed to dissociate or crack the bonds holding the desired component (s) to the metallorganic precursor of solvent in the vaporized source. Sources which could be used as means 8 are ultraviolet lamps and excimer lasers.

Means 10 can be a resistive heat bias type heater controlled by unit 36 to generate a high ambient temperature within chamber 2 and/or to heat substrate 6.

Means 10 is preferably operated to create an ambient temperature within the chamber 2 which is not sufficient in and of itself to dissociate the desired component(s) from the vaporized compound source and deposit these component (s). Means 10 is preferably operated to create an ambient temperature within chamber 2, which, when combined with the tuned spectral bath provided by means 8 and the timed heat pulses of the third means 12, will dissociate the desired component(s) from the vaporized source in an optimized, precisely controlled manner, without detrimentally affecting the deposited thin film of the underlying substrates 6.

Means 12 includes one or more units spaced about chamber 2, and is controlled by unit 36 to apply heat energy heating pulses to the vaporized source within chamber 2 in a carefully timed/synchronized manner corresponding to a plurality of factors, including input flow rate of the vaporized source into chamber 2, desired thin film layer thickness, and (if necessary) the energy requirements needed to activate the thin film being deposited. With many complex thin films, such as ferroelectrics, it is necessary to achieve the ferroelectric phase crystal structure of the film before the film will function in a desired manner.

Means 12 preferably includes one or more halogen lamps, water cooled arc lamps, and/or microwave sources and/or resistive heaters that can be pulsed, placed about chamber 2 and aimed to direct high energy pulses towards a film being deposited.

A freeze drying unit 34 (or cold bed) can be used for lowering the temperature of chamber 2. Unit 34 is controlled by unit 36 according to predetermined parameters.

Figure 2:
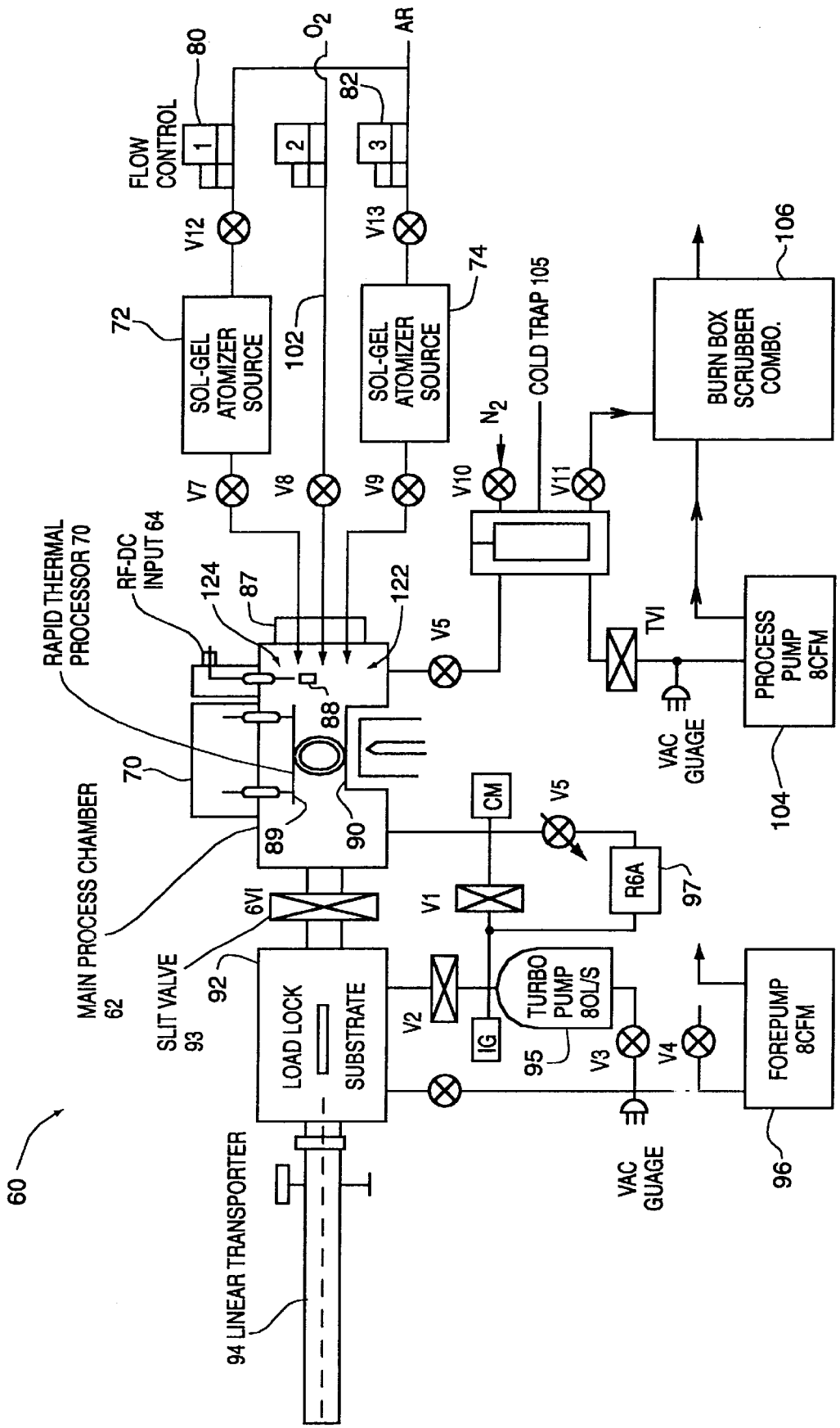
FIG. 2 is a schematic of a second embodiment of the invention.

FIG. 2 shows a second embodiment which is photo/plasma-enhanced rapid thermally pulsed metallorganic CVD from stabilized compound sources as well as from RF decomposition because of the collision of particles.

The second embodiment uses some of the elements described and shown in FIG. 1. To minimize description of the second embodiment, the description of such FIG. 1 elements will not be repeated, and descriptive labels have been included in FIG. 2.

The apparatus 60 shown in FIG. 2 includes a deposition or main process chamber 62 and electrical means 64, for applying an RF bias and a DC bias in the chamber 62. FIG. 2 shows the RF-DC input 64.

There is included a rapid thermal processor 70 having an internal radial heat source for rapid thermal processing, and a plurality of sol-gel atomizer sources 72, 74, with independent sol-gel control panels 80, 82.

Chamber 62 is provided with a demountable rectangular flange 87 through which the plurality of separate vaporized sol-gel sources are introduced. Chamber 62 has a self-contained rapid thermal heating panel 89, RF-electrodes 88, and a thermally controlled heated platen 90.

Processor 70 includes a high-watt density planar surface 89 opposite the heated platen 90. A quartz window protects the planar surface 89 from depositions. Spare ports for viewing and access for other source materials are provided.

Access from a load lock chamber 92 to chamber 62 is provided through an air-operated slit valve 93. A linear transporter 94 enables the movement of substrate from a vacuum load lock to chamber 62.

Chamber 92 is rough pumped, and then high vacuum pumped through a turbomolecular pump 95, backed by a mechanical pump 96, with appropiate valves. An RGA (residual gas analyzer) system including an RGA 97 is also included. A separate mass flow channel 102 is used to introduce oxygen and/or any other process-active or inert gases into chamber 62.

The exhaust system includes a mechanical pump 104, a cold trap 105 with purge features, and a throttle valve with controls. The effluents are directed to a burn box and scrubber combination 106 to assure safe disposal of toxic, corrosive and flammable vapors, if any.

Another aspect of the invention is that the sol-gel compound source is agitated ultrasonically to atomize the compound before it is introduced into the process chamber. Depending upon the particular compound source and application, it may be desirable to heat the lines through which the vapor is introduced into the process chamber.

In a typical CVD process, reagents necessary to form a desired material such as strontium bismuth tantalate are prepared, the reagents are vaporized, and the reagent vapors are fed into a deposition reactor containing a substrate, where they decompose to form a thin film of the desired material on the substrate. The film and substrate are then treated by UV curing, evaporation in a vacuum, and/or baking, and then annealed to form a solid thin film of the desired material, such as strontium bismuth tantalate. As discussed above, the reagent vapors can be formed from solids that are heated to form a gaseous vapor by sublimation and from gases. While an aspect of the invention includes the fact that such solid and/or gaseous sources may be incorporated along with vapors that have liquid sources, to fabricate an integrated circuit material, the aspect of the invention that will primarily be discussed herein is the novel manner of processing the liquid sources, to obtain the gaseous vapor that is utilized in the CVD process. That is, the solid and gaseous source aspects, except for their combination with the liquid sources of this disclosure, are known in the art and the details already discussed are sufficient for one skilled in the art to understand how to incorporate such solid and gaseous sources into the apparatus and methods of the invention.

As is conventional in the art, in this disclosure, the term "substrate" is used in a general sense where it includes one or a number of layers of material, such as 717 (FIG. 10), on which the thin film may be deposited, and also in a particular sense in which it refers to a wafer 751, generally formed of silicon, gallium arsenide, glass, ruby or other material known in the art, on which the other layers are formed. Unless otherwise indicated, it means any object on which a layer of a thin film material is deposited using the process and apparatus of the invention. In the literature, there is often some inconsistent use of such terms as reagent, reactant, and precursor. In this application, the term reagent will be used to refer generally to a chemical compound or its derivative that reacts in the deposition reactor to form the desired thin film. Precursor refers to a particular chemical formulation used in the method that contains a reagent. For example, a precursor may be a pure reagent in solid or liquid form, or it may be a liquid solution of one or more reagents in a solvent. Precursors may be combined to form other precursors. Precursor liquids generally include a metal compound in a solvent, such as sol-gel precursor formulations, which in general are comprised of metalalkoxides in an alcohol solvent, and metallorganic precursor formulations, sometimes referred to as MOD formulations, which in general comprise a metalcarboxylate formed by reacting a carboxylic acid, such as 2-ethylhexanoic acid, with a metal or metal compound in a solvent, combinations thereof, as well as many other precursor formulations. The preferred solvents include methyl ethyl ketone, isopropanol, methanol, tetrahydrofuran, xylene, n-butyl acetate, hexamethyldisilazane (HMDS), octane, 2-methoxyethanol, and ethanol. An initiator, such as methyl ethyl ketone (MEK), may be added just before misting. A more complete list of solvents and initiators as well as specific examples of metal compounds are included in U.S. patent application Ser. No. 08/477,111, filed Jun. 7, 1995, and U.S. Pat. No. 5,614,252, issued Mar. 25,1997 to McMillan et al., which are hereby incorporated by reference to the same extent as if fully set forth herein. The word "reactant" in this application will generally refer to a partially or fully gas phase mixture containing reagents and other compounds; for example, the "reactant gas" in the deposition reactor.

Figure 3:
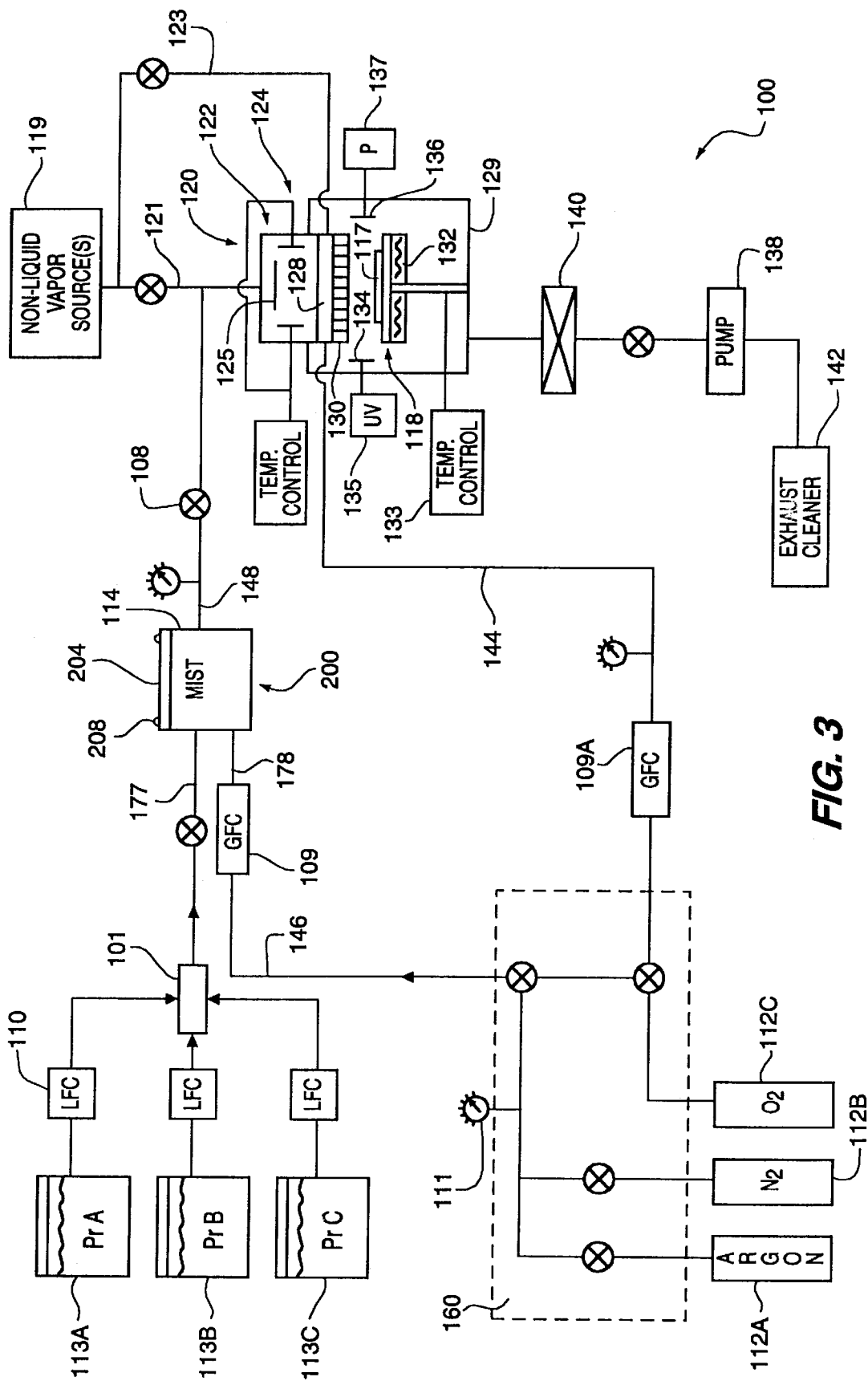
FIG. 3 is a schematic diagram of the preferred embodiment of the CVD apparatus according to the invention.

Directing attention to FIG. 3, a block diagram of the preferred embodiment of the CVD apparatus 100 according to the invention includes a plurality of liquid precursor sources 113A–113C, a generator 114, a deposition chamber system 120 including a mixing zone 122 and a gasification zone 124. The term "gasification zone" refers to the gasification of the liquid precursor. In the preferred embodiment 100, the mixing zone 122 and the gasification zone 124 are separate portions of the deposition chamber; however in other embodiments the zones may be combined within the same portion of the deposition chamber. For example, in the embodiment of FIG. 1, the mixing zone 122 is a separate manifold 122, while the heating zone 124 is in a separate physical chamber, while in the embodiment of FIG. 2, the two zones 122 and 124 are combined within the same physical chamber. The liquid precursors $Pr_A$–$Pr_C$ are combined and mixed in liquid mixer 101 and flow through mist generator 114, which creates a mist of small liquid droplets in carrier gas. If other non-liquid gasified vapor sources, such as the solid and gas sources of FIG. 1, are used, they either are mixed with the mist in mixer 122 via conduit 121 or are mixed with the gasified liquid and oxygen in mixer 128, preferably the latter. The temperature of the process streams being mixed is controlled to avoid premature decomposition, on the one hand, and to avoid condensation of reagent vapors, on the other hand. The resulting reactant gas flows through showerhead injector 130 towards the substrate 117, where it decomposes to form the desired thin film. Liquid flow controllers, such as 110, and gas flow controllers, such as 109 and 109A, and valves, such as 108 control the flow of liquid and gas through the system. Pressure gauges, such as 111, enable measurement and therefore control of the flow rate and composition of the process streams, and thus the stoichiometry of the deposited thin film. Conduits such as 144, 146 and 148, preferably stainless steel tubing, carry the mist and gases throughout the system.

Energy is supplied to the reaction system by the substrate heater 132, located in substrate holder 118. Substrate temperature controller 133 controls electrical power to the substrate heating unit. The reaction system alternatively also receives energy from other reaction enhancement means, such as UV source 134 controlled by UV controller 135 and plasma-generator 136 controlled by plasma generator controller 137. Pump 138 removes the undesired reaction by-products, principally organics, and any unreacted precursor and assists in the movement of precursor vapor into and through the showerhead injector 130. Cold trap 140 traps most of the materials exhausted from reactor 129 before they reach pump 28. Exhaust cleaner 142 which is preferably a gas absorber, removes any remaining reactants. The precursor mist generator preferably comprises a venturi mister. The carrier gas is typically argon or nitrogen. The settings of the mist generator and the inlet flow rates of liquid and carrier gas can be varied within ranges to produce a mist of desired droplet size and mass flow rate. Small droplet size in the mist enables the liquid droplets to be vaporized at relatively low temperature to avoid premature decomposition.

In the preferred embodiment of FIG. 3, the precursors are mixed to form a single precursor prior to misting. It is most preferred that all precursor compounds, including additives, be mixed in one common solvent, that can be safely stored without reaction or decomposition for long periods. If that is possible, then there will be only one liquid precursor solution, and only one precursor source, say precursor source 113A, and one mist generator, i.e. mist generator 114, will be used in the process. If, for example, the material being made is a bismuth layered superlattice compound, there will be a Bi-containing metal oxide precursor and one polyalkoxide precursor, containing all of the elements in the formula for forming the layered superlattice material. In some instances, there can be a common solvent, but it must be mixed "on the fly" just prior to misting. In that case, there will be two or more liquid precursor sources that are mixed in liquid mixer manifold 101 just prior to misting and one mist generator 114 as shown in FIG. 3.

The gas sources preferably include an argon source 112A, an oxygen source 112C, and one or more sources 112B of other gases, such as dry nitrogen. Liquid flow controllers 110 control the flow of liquid precursors to the mixer 101 and hence to the mist generator 114. Gas flow controller 109 controls the flow of carrier gas to the mist generator 114. Liquid sources 113A–113C, liquid manifold 101, the valve array, and the gas sources 112A–112C are arranged so that liquid from any one of liquid sources 113A–113C and gas from any one of gas sources 112A–112C can be directed to mist generator 114. Likewise gas flow controller 109A adjusts the flow of oxygen in conduit 144 so the proper amount of oxygen enters reactor 129. The precursors to be combined are placed in the liquid precursor sources 113A–113C, and are indicated generally in FIG. 3 as $Pr_A$, $Pr_B$, and $Pr_C$. The precursors will depend on the material it is desired to deposit; specific examples will be discussed in detail below.

Figure 4:
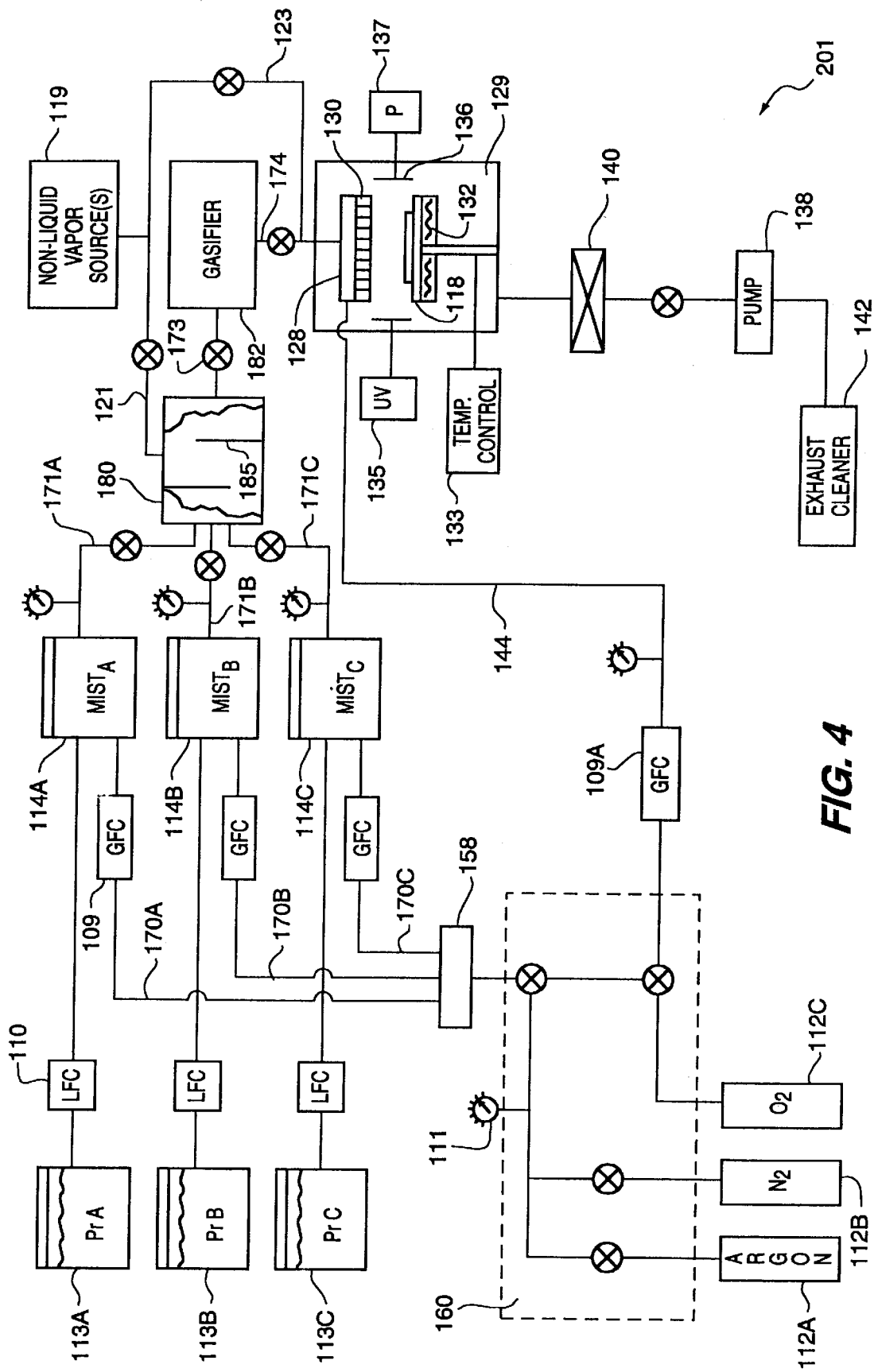
FIG. 4 is a schematic diagram of an alternative preferred embodiment of the CVD apparatus of the invention when a single precursor is not available for the desired end product.
Figure 5:
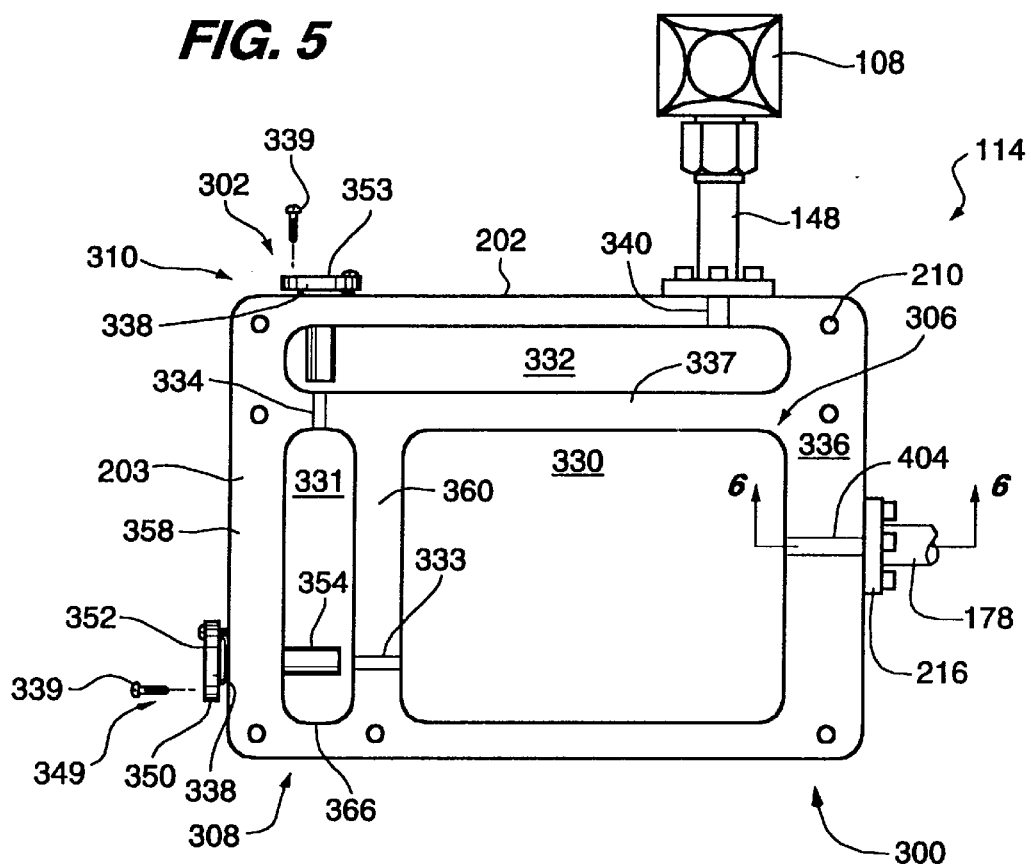
FIG. 5 is a perspective view of the mist generator according to the invention.
Figure 6:
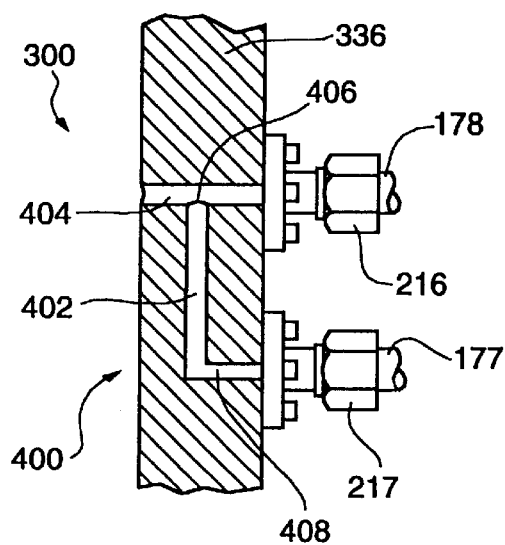
FIG. 6 is a cross-sectional view of the mist generator of FIG. 5 taken through the line 6—6 of FIG. 5.
Figure 7:
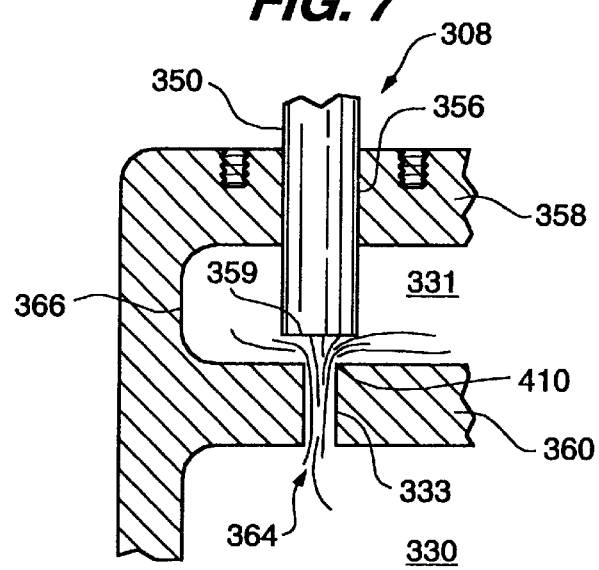
FIG. 7 is a cross-sectional view of the mist generator of FIG. 5 taken through the mist filter.

FIG. 4 is a schematic of an alternative preferred embodiment of a CVD apparatus 201 which is used if a single precursor solution cannot be formed prior to misting. In this embodiment, parts which are the same as parts in the embodiment of FIG. 3 are numbered the same, and will not be discussed again in detail. In this case there is a mist generator, such as 114A, 114B, and 114C for each of the liquid sources 113A, 113B, and 113C. Three precursor sources and three mist generators are shown only by way of example. Depending of the chemistry in the specific case, there may less or more of each. Gas manifold 158, valve array 160, indicated by the dotted lines, and the gas flow controllers 109 are arranged so that gas from any one of gas sources 112A–112C may be directed to any one of conduits 170A, 170B, and 170C. In the preferred embodiment of the process of the invention, they are arranged so that oxygen flows through conduit 144 to the mixer 128 in deposition reactor 129, while the argon from gas source 112A is directed through conduits 170A–170C and thence to mist generators 114A–114C. Gas flow controllers, such as 109, on each of conduits 170A–170C and 144 adjust the flow in each conduit so that the proper amount of oxygen enters reactor 129 and the proper flow rates of carrier gas flow through the mist generators 114A–114C. In general, the mass flow rate of each reagent to the deposition reactor 129 depends on the concentration of the reagent in the liquid precursor solution and the rate of mist production in and mist transport from mist generator 114A–114C. Thus, to get the desired proportions and amounts of vaporized reagents into deposition reactor 129, each mist generator 114A–114C will be operated at different conditions, and the flow of carrier gas to each of the mist generators 114A–114C will be different. The misted liquid precursor streams exiting from each mist generator 114A–114C flow through conduits 171A–171C into mist mixer manifold 180 where the streams are combined and mixed with the assistance of baffles such as 185, and thence to gasification zone 182, where the small liquid droplets of the mist are gasified at low temperature. In this embodiment, the mist manifold 180 and the gasifier 182 are separate units, though they could be combined or made as portions of the same physical unit as in previous embodiments. Again, if other nonliquid gasified vapor sources, such as the solid and gas sources of FIG. 1, are used, they either are mixed with the mist in mixer 122 via conduit 121 or are mixed with the gasified liquid and oxygen in mixer 128, preferably the latter. Turning to FIGS. 5–7 the preferred embodiment of the mist generator 114, 114A–114C according to the invention is shown. The mist generators are all the same, so we shall discuss mist generator 114 only. As shown in FIG. 3, the mist generator 114 includes a housing 200 having a body portion 202 and a cover portion 204. Cover 204 attaches to body portion 202 with bolts 208 which screw through threaded bores in cover 204 and screw into threaded bores 210 (FIG. 5) in body portion 202. The upper surface 203 of body portion 202 and the undersurface of cover 204 are ground smooth so that they seal tightly when bolts 208 are tightened. Each of liquid conduit 177 (FIG. 6), gas conduit 178, and mist conduit 148 connects to housing body 202 via a sealed connector, such as 216. A liquid mass flow controller 110 is located between each precursor liquid container, such as 113A, and connector 216. Alternatively this may be a micrometer valve with a knob that would be attached to a fine screw thread (not shown) that permits minute adjustments of the flow of precursor liquid into mist generator 114 (FIG. 5).

Turning our focus now to FIG. 5, body 202 comprises a cube approximately five inches on a side and having three hollowed out chambers 330, 331, and 332. First chamber 330 is preferably roughly cubical and about three inches on each side, second chamber 331 is preferably oblong and about three inches long, ¾ inches wide and three inches deep. Third chamber 332 is also preferably oblong and about four inches long, ¾ inches wide and three inches deep. Chamber 330 houses the first stage 306 of mist refiner 302, chamber 331 houses the second stage 308 of mist refiner 302, and chamber 332 houses the third stage 310 of mist refiner 302. Passage 333 connects first chamber 330 with second chamber 331, passage 334 connects second chamber 331 with third chamber 332, and passage 340 connects third chamber 340 with conduit 46. Sidewall 336 of housing body 202 is about ½ inches thick and houses the venturi-mister 300. FIG. 6 shows a cross-section through sidewall 336 and shows the venturi-mister 300 in detail. Venturi-mister 300 includes a liquid vessel 402, which is preferably a capillary tube, and a gas passage 404 which meet at throat 406. Preferably, throat 406 is on the underside of gas passage 404, and liquid vessel 402 lies beneath throat 406 so that liquid is pulled into passage 404 by the movement of the gas across throat 406. As indicated above, the gas enters passage 404 via conduit 178 and connector 216, while the liquid enters via conduit 177 and connector 217. Passage 404 is offset from the position of passage 333 to prevent streaming of mist particles through chamber 330 directly from passage 404 to passage 333. That is, this arrangement permits the mist to equilibrilize in chamber 330 before passing on to the next stage of particle refining.

Each stage of mist refiner 302 comprises an inertial separator, 306, 308 and 310. Inertial separator 306 includes the chamber 330 and the misaligned passages 404 and 333. In this embodiment of the inertial separator, any overly large mist particles will strike wall 360 and stick. The liquid from the particles that stick to wall 360 tube 320 will collect in chamber 330. It should be understood that whether any given particle will stick to wall 360 or some other part of the mist refiner 302 is statistical in nature. While the statistical probability that a particle will stick increases as the size and mass of the particle increases, it is still a probability. Thus, some particles larger than a given size may make it through the mist refiner without sticking, while others smaller than the given size may stick. However, overall, when considering a large number of particles with a distribution of sizes, the largest of the particles will tend to be filtered out by the mist refiner 302, and as a result the distribution of particles will shift to a distribution corresponding to a smaller mean particle size.

Inertial separator 308 is shown in FIG. 5 and in a cross-sectional detail in FIG. 7. Stage 308 comprises chamber 331, passage 333, and separator piston assembly 349. Separator piston assembly 349 preferably comprises a piston 350, including a head 352 and a stem 354, an O-ring 338 that fits in a groove between head 350 and wall 358, and four screws, such as 339, that pass through bores in head 352 and screw into threaded holes in wall 358. Stem 354 fits snugly in bore 356 (FIG. 7) in wall 358. The end 359 of piston 350 is preferably blunt, and most preferably substantially flat. The mister/refiner system 114 includes several different pistons 350 having different length stems 354. Thus the position of the blunt end 359 from exit 410 of passage 333 can be adjusted by replacing one piston 350 with another piston having a stem 354 of a different length. Passage 333 is preferably a cylindrical bore of about 2 millimeters in diameter and is located in wall 360 directly opposite the end 359 of piston 350. That is, it is centered with respect to bore 356 in wall 358. The difference in pressure between the pressurized gas source 112A and the pressure in reaction chamber 129 causes the mist in chamber 330 to flow through passage 333 into chamber 331. The mist is collimated in passage 333. As indicated by the streamlines 364, the presence of the blunt piston end 359 opposite the passage 333 deflects the flow of mist particles; more technically, it adds a radial vector to the flow of gas and mist particles, i.e. causes the flow to change in direction of the radii of the circle circumscribed by the end 359 of separator piston 349. Again, the larger the particle, the greater its mass and inertia, and the higher probability there is that it will strike and stick to the end 359. The particles that stick to the end 359 will collect and drip off the end into chamber 331. Thus, the distribution of particles is again shifted toward smaller particle size. The closer the piston end 359 is to the exit 410 of passage 333, the more the particles will have to alter their direction, and the greater will be the probability of particles sticking to end 359, and the more particles will stick. In addition, the range of particle sizes that have a probability of sticking that is higher than a given probability will extend into smaller and smaller particle sizes as the end 359 is moved closer to the exit 410 of channel 333. Thus, the distribution of particle sizes, i.e. the mean or average particle size, may be selected by adjusting the position of the end 359 of stem 350. As the end 359 is adjusted closer to pressurized reservoir 333, the distribution of particle sizes in the mist shifts to a smaller particle size and a reduced mean and average particle size. As the end 359 is adjusted away from the exit 410, the distribution of particle sizes in the mist shifts toward a larger particle size. Put another way, if the piston 350 is made longer, the mean and average particle sizes in the mist decrease, and as the piston 350 is made shorter, the mean and average particle sizes in the mist increase. Preferably, exit 410 is located far enough from the end wall 366 of chamber 331 and far enough from the top 203 of body 202 that the end wall 366 and the cover 205 do not significantly interfere with the flow around the end 359. The length of chamber 331 and the placement of the exit passage 334 at the end of chamber 331 located farthest from passage 333, prevents particles from streaming from exit 410 through passage 334 without undergoing many collisions which tend to randomize the particle velocity vectors. The structure and operation of third mist refiner stage 310 is the same as that of second stage 308, except for minor and essentially immaterial differences, such as the slightly different length of chamber 332 and the relative placement of the exit passage 340 with respect to entrance passage 334.

Figure 8:
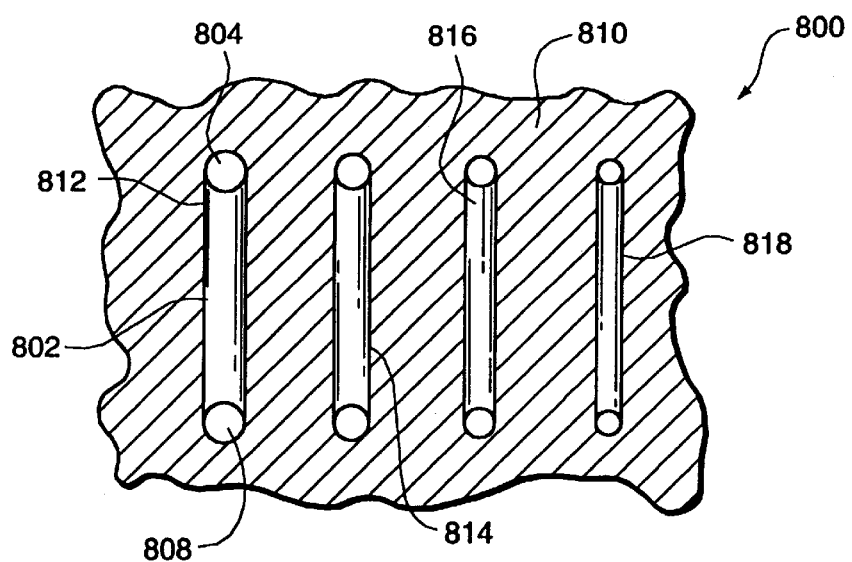
FIG. 8 is a cross-sectional view of a variable-venturi embodiment of the mist generator according to the invention.

FIG. 8 shows a cross-section of the preferred embodiment of a variable venturi mist generator 800. This mist generator is similar to mist generator 114 except that it has four different venturi-misters, 812, 814, 816, and 818. Each venturi-mister includes a horizontal gas passage 804 (corresponding to gas passage 404 in FIG. 6), a vertical liquid passage 802 (corresponding to vertical liquid passage 402 in FIG. 6) which connects to a horizontal liquid passage 808 (corresponding to gas passage 408 in FIG. 6). The size of the passages, such as 802, 804 and 808, is different in each venturi-mister 812, 814, 816, and 818. Preferably they vary from about ¼ millimeter to 2 millimeters in diameter. In the embodiment shown, the gas and liquid passages are of the same size in a particular venturi-mister, but this is not necessary, since they can be of different sizes. The different size of the passages in the venturi-misters result in different mass flow through each venturi-mister, allowing the user to have a different parameter, other than gas and liquid flow rates, that can separately be adjusted to adjust the flow of mist. Each venturi-mister is attached to a different liquid and gas flow line than the other venturi-misters, each with its respective liquid flow controller, such as 110 (FIG. 4), and gas flow controller, such as 109, which allows the user to control which venturi-mister 812–818 is to be used, and thereby control the mass flow of each mist of each precursor through the system. The system 800 thus comprises a venturi with an adjustable gas passage throat and an adjustable liquid passage throat.

Figure 9:
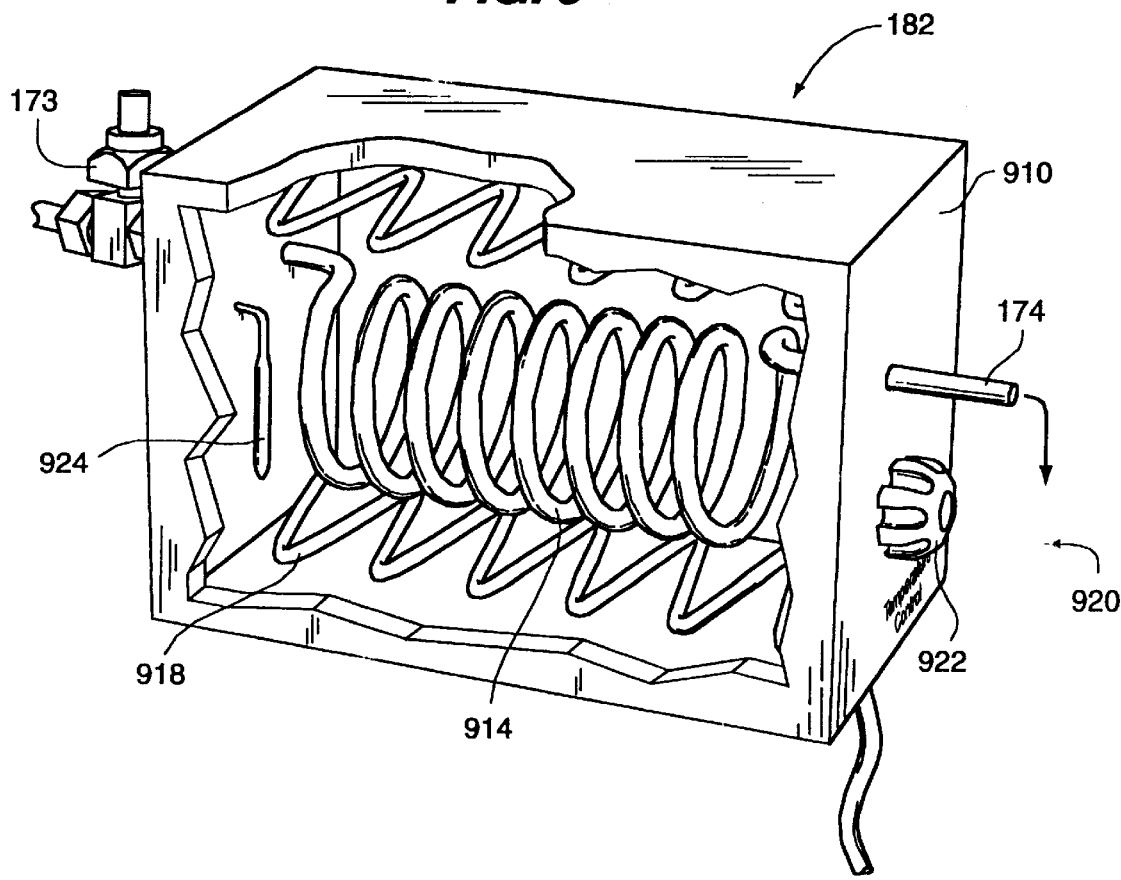
FIG. 9 is a partially cut away perspective view of the preferred embodiment of the vaporizer according to the invention.

FIG. 9 shows the preferred embodiment of gasifier 182. Gasifier 182 comprises an insulated housing 910, a spiral mist conduit 914, a heating coil 918, and a temperature control system 920 including a thermocouple 924 and a control unit 922. Spiral conduit 914 is preferably made of a stainless steel that conducts heat relatively easily. Conduit 914 connects to valve 173 at one end and to mist conduit 174 at the other. Temperature control system 920 is conventional and permits the temperature to be maintained in housing 910 at a temperature of between 50° C. and 250° C. Preferably the temperature within housing 910 is maintained in the range of 100° C. to 200° C.

Figure 10:
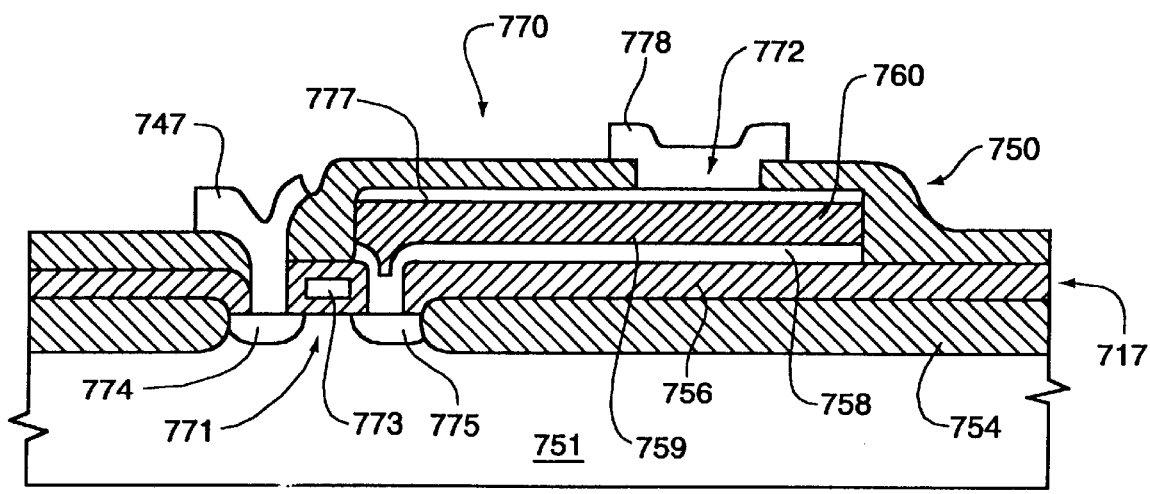
FIG. 10 is a cross-sectional view of an exemplary integrated circuit as may be fabricated by the process of the invention showing a memory cell of a non-volatile ferroelectric memory.

FIG. 10 shows an example of the integration of a material 760 made according to the process of the invention, such as a layered superlattice compound 760, into a memory cell 750 to form an integrated circuit 770 such as may be fabricated using the invention. The memory cell 750 preferably includes a silicon substrate 751, field oxide areas 754, and two electrically interconnected electrical devices: a transistor 771 and a capacitor 772. If the material 760 is a dielectric material, then the memory cell 750 is a DRAM memory cell, and if the material 760 is a ferroelectric material the memory cell 750 is an FeRAM memory cell. Transistor 771 includes a gate 773, a source 774, and a drain 775. Capacitor 772 includes first electrode 758, material 760, and second electrode 777. Insulators, such as 756, separate the devices 771, 772, except where drain 775 of transistor 771 is connected to first electrode 758 of capacitor 772. Electrical contacts, such as 747 and 778 make electrical connection to the devices 771, 772 to other parts of the integrated circuit 770. A detailed example of the complete fabrication process for an integrated circuit memory cell as shown in FIG. 10, except for the process of fabricating the layer 760, is given in U.S. Pat. No. 5,466,629 which is incorporated herein by reference. The process for fabricating the layer 760 is discussed herein. Typically the layer 760 is a thin film of thickness of between 200 Å and 5000 Å. It should be understood that FIG. 10 depicting the integrated circuit 70 is not meant to be an actual cross-sectional view of any particular portion of an actual electronic device, but is merely an idealized representation which is employed to more clearly and fully depict the structure and process of the invention than would otherwise be possible.

2. Detailed Description of the Fabrication Process

Figure 11:
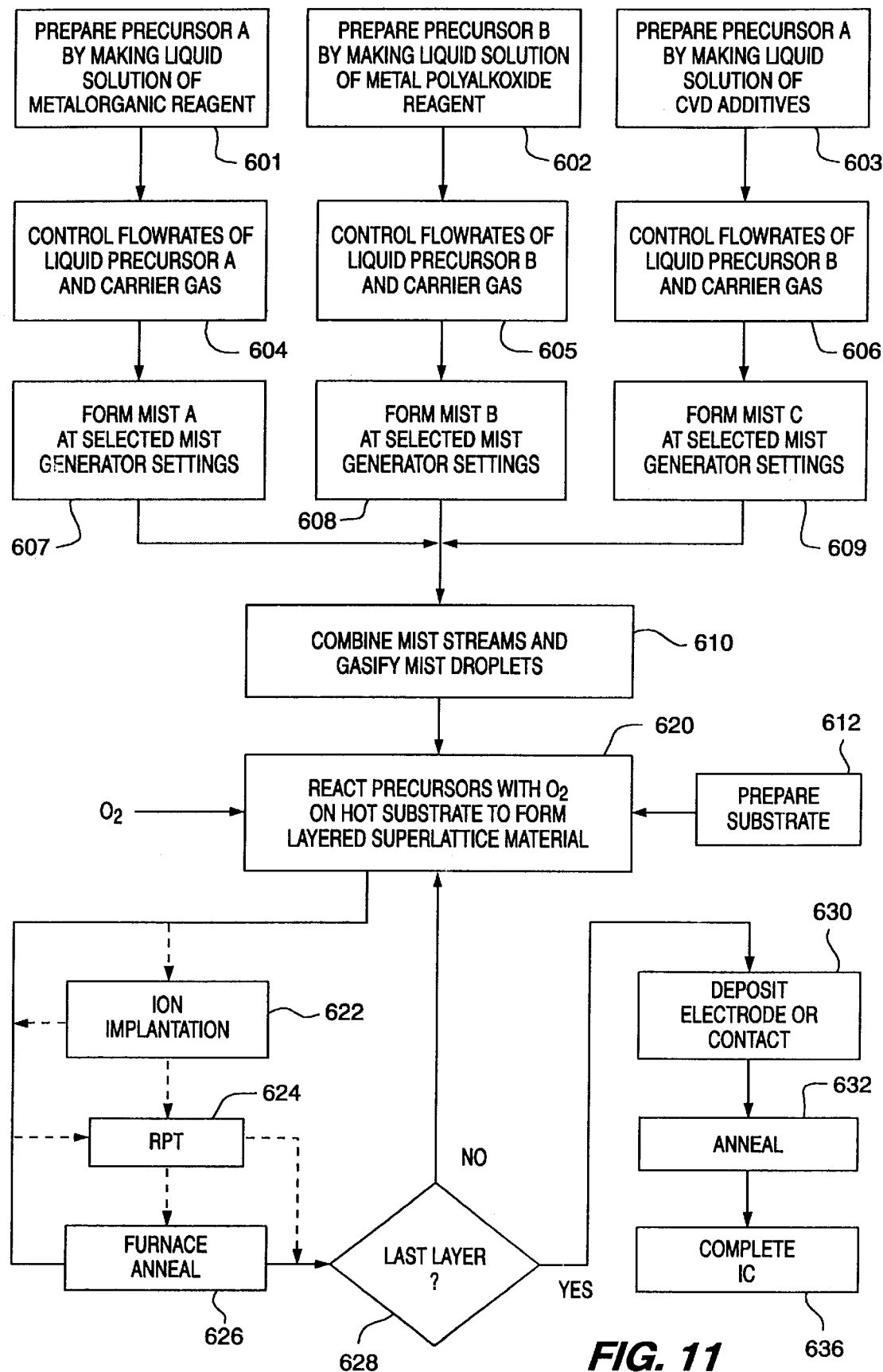
FIG. 11 is a flow chart showing the steps to produce a thin film in an integrated circuit in a typical CVD process according to the invention.

Turning now to FIG. 11, a flow chart of the preferred embodiment of a CVD process according to the invention for preparing a thin film of a layered superlattice material 760 is shown. The first steps 601–603 of the process Involve the preparation of the precursors, $Pr_A, Pr_B \ldots Pr_N$. The CVD reagent is formed by reacting the metal with an organic reactant to form a metalorganic compound. In many cases, the organic reagent is readily available commercially. In other cases, a commercially available intermediate compound of the metal may be reacted to form the desired reagent. In all cases, the preferred precursors are metalorganic liquids, so it may be necessary to dissolve solid reagents in a suitable solvent. Specific examples will be discussed below. Often the steps 601–603 may include several stages which may be separated considerably in time. In the first stage, the reagent may be dissolved in a suitable solvent and concentrated so as to provide a long shelf life. Just before use, the solvent may be distilled out. Or an intermediate compound of the metal that has a long shelve life may be prepared or purchased, and the final precursor formed by way of a reaction just prior to use. When the precursors are ready, they are transferred to the liquid precursor sources, such as 113A–113C, (FIGS. 3 and 4), and are transported at controlled flow rates to the mist generators in steps 604–606, which make mists of the individual precursors in steps 607–609. The misted precursor streams are combined and gasified in step 610.

Substrate 717 is prepared in step 612, independently of steps 601–610. If the substrate is a metallized substrate, such as the substrate 717 in FIG. 10, then the substrate is prepared in step 612 by forming the layers 754, 756, and 758 on silicon wafer 751 and is then prepared. The prebaking step comprises baking in an oxygen furnace, preferably at a temperature of between 500° C. and 900° C., preferably at about 650° C. The substrate prebake removes water and organic impurities from the substrate surface and decreases the internal stress of the metal layer 758, thereby increasing the adhesion between the substrate 717 and the layered superlattice compound or other thin film 760. This prebake step is important for preparing electronic devices of high quality. If the substrate is a nonmetallized substrate, such as a silicon or gallium arsenide single crystal, the substrate is dehydrated in step 612.

In step 620, a layered superlattice compound, an $ABO_3$ type metal oxide, or other material 760 is deposited on the substrate 717 by one of the embodiments of the CVD apparatus described above in reference to FIGS. 1–7. Preferably the temperature of substrate 717 during deposition is between 300° C. and 500° C., the exact temperature depending on the material to be formed. The pressure in deposition reactor 129 is preferably between 1 milliTorr and 850 Torr. The vapor pressures of the individual precursor vapors depends on the precursor and will be discussed below in connection with the precursors.

The film formed in step 620 contains all the metal elements of the desired metal oxide, in particular a layered superlattice material, and generally contains most but not all of the oxygen necessary to form the final desired material. It also may contain other organics from the precursor. It may be in an amorphous form, in a partially crystallized form, or in a form with a different crystallization than the final form desired. In steps 622 through 626 the film is treated to form the final desired layered superlattice material. Preferably the integrated circuit wafer 70 is removed from the deposition reactor before this treatment. This avoids the problem of possible contamination by materials on the walls of the reactor. The preferred treatment follows the solid lines in FIG. 11, while the dotted lines indicate alternative or optional treatments. After formation in step 620, the film 60 is crystallized or recrystallized, preferably by a furnace anneal step 626, and alternatively by an RTP step 624. The term crystallization or recrystallization is used because if the film is amorphous after step 620, then the furnace anneal and/or RTP process 626, 624 is a crystallization process, but if the film is polycrystalline after step 620, the process is a recrystallization process. For simplicity, in the discussion hereinafter, including the claims, wherever the term "crystallization" is used, it means both crystallization and recrystallization. The furnace anneal is performed at a temperature of from 650° C. to 900° C., preferably from 700° C. to 800° C., and most preferably at about 750° C., for from 15 minutes to three hours, and preferably for about 30 minutes. The RTP step is preferably at a temperature of from 500° C. to 850° C., and for from 3 seconds to 5 minutes, and most preferably at a maximum temperature of 725° C. with a ramping rate of 125° C. per second, a hold time of 30 seconds, and a natural cool time of 6 minutes, in an ambient oxygen flow of approximately 100–2200 cc/minute. Optionally an ion implantation step 622 may be performed prior to the RTP step 624 or furnace anneal step 626 to create crystallization sites. The ion implantation step 622 preferably employs implantation with argon, helium, oxygen or similar ions. This step creates additional nuclei for growing grains with mixed orientation. The RTP step promotes nucleation, i.e. the generation of numerous small crystalline grains of the layered superlattice material of mixed orientation in the solid film 60. These grains act as nuclei upon which further crystallization can occur. The oxygen furnace anneal is particularly useful when the CVD formed film has significant oxygen deficiency. In addition to the advantages mentioned above, the steps 622 though 626 of treating the thin film 60 in general provide films of better stoichiometry than films that are not so treated. The ion implantation step, the furnace anneal, and the RTP step are preferably performed after removing the substrate 717 from the reaction chamber 129.

In some cases, parthe process on films of greater than 1000 Å are desired, the process of forming the thin film 60 is done in several layers. This ensures that the inner portions will also be predominately mixed phase rather than predominately one-axis orientation. In these cases the steps from 620 through 628 are repeated until the desired thickness is obtained. If the steps 620 through 628 are repeated, they may or may not be carried out in the same equipment. The electrode 777, or other contact layer in the case of other embodiments, is then formed by sputtering or other suitable process. Preferably the top or second electrode 777 is made of approximately 2000 Å of platinum. The integrated circuit wafer is then annealed in step 632. This anneal is preferably at the same temperature as the first furnace anneal step 626. Preferably in step 632 the anneal temperature is between 650° C. and 900° C. for a time period of 15 minutes or more. Usually this anneal time is 120 minutes or less, but longer times are sometimes required. The anneal step 632 releases the internal stress in the top electrode 777 and in the interface between the electrode 777 and the layered superlattice material 760. At the same time, the annealing step 632 reconstructs microstructure in the layered superlattice material 60 resulting from the sputtering of the top electrode, and as a result improves the properties of the material. The effect is essentially the same whether the anneal 632 is performed before or after the patterning of the capacitor 772. The term "electrode or contact" is used above because in the integrated circuit shown, the layer 777 adjacent thin film layer 760 is an electrode, but in other embodiments, the term "contact" may be more appropriate, as for example when a wiring layer contacts the layered superlattice material directly. However, in their broadest meanings, the words "contact" and "electrode" are interchangeable, since electrode 777 also "contacts" the material 760. Hereinafter, for simplicity, the word "electrode" will be used when referring to this layer 777 through which electrical contact is made to material 60, with the understanding that it means any such "electrode" or "contact". The integrated circuit 770 is then completed in known processes in step 636.

It also should be noted that the invention contemplates that if the material 760 is a layered superlattice compound, it may be either a ferroelectric or a dielectric material, or both. That is, while in the preferred embodiment the layered superlattice material 760 is a ferroelectric, in other embodiments it may be a dielectric, or both a ferroelectric and dielectric. If it is a dielectric only, the capacitor 772 is a dielectric capacitor, and the integrated circuit 770 is a volatile memory.

It should be understood that the specific processes and electronic devices described herein are exemplary; that is the invention contemplates that the layers in FIG. 10 may be made of many other materials than those mentioned above and described below, there are many other variations of the process of the invention than can be included in a document such as this, and the method and materials may be used in many other electronic devices other than the integrated circuit 770. It should also be noted that the word "substrate" is used in both a specific and a general sense in this disclosure. In the specific sense it refers to the specific silicon layer 751, conventionally called a silicon substrate, on which the exemplary electronic device 770 described is fabricated. In a general sense, it refers to any material, object, or layer on which another layer or layers are formed. In this sense, for example, the layers 751, 754, 756, and 758 comprise a substrate 717 for the layer 760.

As used herein, the term stoichiometric generally expresses a relationship between the various elements that make up the desired final thin film 760. A "stoichiometric" thin film is one in which the relative proportions of the various elements in the thin film 760 are as given in the chemical formula for the material 760.

The crystallographic orientations of the layered superlattice material compounds are described herein in terms of a C-axis and an A-axis orientation. The C-axis is the crystal axis that passes through the planes of the alternating layers of the layered superlattice material. The A-axis is one of the four axes parallel to such planes. The definitions of the various axes, such as the A-axis and the C-axis, are known for layered superlattice materials. It is believed the good results of the process according to the invention arise from the fact that the process according to the invention yields grains oriented in a more mixed crystal phase rather than being predominately a phase that gives poor electronic properties. However, a complete crystallographic understanding of the layered superlattice materials made by the process of the invention has not yet been accomplished. Thus, it should be understood that while the process of the invention results in better electrical properties than the processes of the prior art, the reasons given herein for the good properties may change when a more complete crystallographic understanding of these materials is obtained.

The apparatus and process of the invention is very useful for forming a wide variety of integrated circuit materials, for example metal oxides having the general formula $ABO_3$, such as barium strontium titanate, and layered superlattice compounds, such as strontium bismuth tantalate. Layered superlattice compounds, alternatively referred to as layered superlattice materials herein, are materials that spontaneously form into compounds having distinct layers. These compounds have a dual periodicity, which is the reason why they are termed "superlattices". They should be distinguished from compositional superlattices which are heterostructures, that is, they are artificial or forced superlattices, as compared to the layered superlattice compounds which spontaneously form superlattices. Layered superlattice materials may be summarized generally under the formula:

$$A1_{w1}^{+a1}A2_{w2}^{+a2} \ldots Aj_{wj}^{+aj}S1_{x1}^{+s1}S2_{x2}^{+s2} \ldots Sk_{xk}^{+sk}B1_{y1}^{+b1}B2_{y2}^{+b2} \ldots Bl_{yl}^{+bl}Q_z^{-2}, \qquad (1)$$

where A1, A2 . . . A represent A-site elements in the perovskite-like structure, which may be elements such as strontium, calcium, barium, bismuth, lead, and others, S1, S2 . . . Sk represent superlattice generator elements, which usually is bismuth, but can also be materials such as yttrium, scandium, lanthanum, antimony, chromium, thallium, and other elements with a valence of +3, B1, B2 . . . Bl represent B-site elements in the perovskite-like structure, which may be elements such as titanium, tantalum, hafnium, tungsten, niobium, zirconium, and other elements, and Q represents an anion, which may be elements such as oxygen, fluorine, chlorine and hybrids of these elements, such as the oxyfluorides, the oxychlorides, etc. In this disclosure we are primarily interested in the layered superlattice oxides, which include the materials in which Q is oxygen as well as the hybrids that include oxygen. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound then it is represented by the "A1" element and w2 . . . wj all equal zero. If there is only one B-site element in the compound, then it is represented by the "B1" element, and y2 . . .yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1+a2w2 \ldots +ajwj)+(s1x1+s2x2 \ldots +skxk)+(b1y1+b2y2 \ldots +bjyj)=2z. \quad (2)$$

The layered superlattice materials do not include every material that can be fit into the formula (1), but only those which spontaneously form themselves into crystalline structures with distinct alternating layers.

It should also be understood that the term layered superlattice material herein also includes doped layered superlattice materials. That is, any of the materials included in formula (1) may be doped with a variety of materials, such as silicon, germanium, uranium, zirconium, tin or hafnium. For example, strontium bismuth tantalate may be doped with a variety of elements as given by the formula:

$$(Sr_{1-x}M1_x)Bi_2(Nb_{1-y}M2_y)O_9+\alpha M3O, \quad (3)$$

where M1 may be Ca, Ba, Mg, or Pb, M2 may be Ta, Bi, or Sb, with x and y being a number between 0 and 1 and preferably $0 \leq x \leq 0.2$, $0 \leq y \leq 0.2$, M3 may be Si, Ge, U, Zr, Sn, or Hf. and preferably $0 \leq \alpha \leq 0.1$. Materials included in this formula are also included in the term layered superlattice materials used herein.

Similarly, a relatively minor second component may be added to a layered superlattice material and the resulting material will still be within the invention. For example, a small amount of an oxygen octahedral material of the formula $ABO_3$ may be added to strontium bismuth tantalate as indicated by the formula:

$$(1-x)SrBi_2Ta_2O_9+xABO_3, \quad (4)$$

where A may be Bi, Sr, Ca, Mg, Pb, Y, Ba, Sn, and Ln; B may be Ti, Zr, Hf, Mn, Ni, Fe, and Co; and x is a number between 0 and 1, preferably, $0 \leq x \leq 0.2$.

Likewise the layered superlattice material may be modified by both a minor $ABO_3$ component and a dopant. For example, a material according to the formula:

$$(1-x)SrBi_2Ta_2O_9+xABO_3, +\alpha MeO, \quad (5)$$

where A may be Bi, Sb, Y and Ln; B may be Nb, Ta, and Bi; Me may be Si, Ge, U, Ti, Sn, and Zr; and x is a number between 0 and 1, preferably, $0 \leq x \leq 0.2$, is contemplated by the invention.

A feature of the invention is that many different possible precursors may be used. Typical chemistry families that may be used as precursors are the alkoxides which include: methoxide $[M(OCH_3)_n]$, ethoxide $[M(OCH_2)_5]$, $_n$ propoxide $[M(OC_3H_7)]$, and butoxide $[M(OC_4H_9)n]$, where M is a metal and n is the number of alkoxyl bases combining with the metal and is equal to the valence of the metal. Sometimes the use of a methoxide, for example, for one metal and the use of a propoxide, for example, for another metal gives better results than using compounds from the same family. A polymerized alkoxide can also be used for the CVD source. A preferable length of the alkoxide polymer chain is between 1 and 5 monomer units. Other chemistry families that may be used are the betadiketonates such as acetylacetonate with the formula:

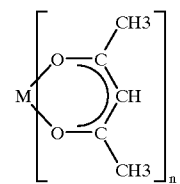

where M represents metal and n represents the number of monomers, and benzoilacetonate with the formula:

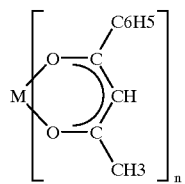

As indicated above the layered superlattice materials may include metals such as strontium, calcium, barium, bismuth, cadmium, lead, titanium, tantalum, hafnium, tungsten, niobium zirconium, bismuth, scandium, yttrium, lanthanum and the lanthanides, antimony, chromium, molybdenum, vanadium, ruthenium and thallium. Some examples of precursors that may be used for some of these metals are given in Table I.

TABLE I

| METAL | PRECURSOR FORMULA | CHEMICAL NAME OR NAMES |
|---|---|---|
| Strontium | Sr(DPM)$_2$ | Dipivaloylmethanato strontium or Bis (2,2,6,6,-tetramethyl-3,5-heptanedionato)-strontium or strontium dipivaloyl-methanate |
| | Sr(Cp)$_2$(THF)$_2$ | Bis (pentamethyl-cyclopentadienyl)-bis (tetrahydrofran) strontium |
| | Sr(DPM)$_2$(Phen)$_2$ | Bis (2,2,6,6,-tetramethyl-3,5-heptanedionato)-bis (1,10-phenanthroline) strontium |

TABLE I-continued

| METAL | PRECURSOR FORMULA | CHEMICAL NAME OR NAMES |
|---|---|---|
| Bismuth | $BiPh_3$ | Triphenyl bismuth |
| | $Bi(OiPr)_3$ | Triisopropoxy bismuth |
| | $Bi(DPM)_3$ | Bismuth dipivaloylmethanate |
| Barium | $Ba(DPM)_2$ | Barium dipivaloylmethanate |
| Lead | $Pb(DPM)_2$ | lead dipivaloylmethanate |
| | $Pb(C_2H_5)_2$ | Diethyl lead |
| Tantalum | $Ta(OCH_3)_5$ | Pentamethoxy tantalum |
| | $Ta(OC_2H_5)_5$ | Pentaethoxy tantalum |
| | $Ta(OC_3H_7)_5$ | Pentapropoxy tantalum |
| | $TaCl_5$ | Pentachloro tantalum |
| Niobium | $Nb(OC_2H_5)_5$ | Pentaethoxy niobium |
| | $NbCl_5$ | Pentachloro niobium |
| | $Nb(DPM)_2Cl_3$ | Dipivaloylmethanato trichloro niobium |
| Antimony | $Sb(OC_2H_5)_3$ | Triethoxy antimony |
| Titanium | $Ti(OiPr)_2(DPM)_2$ | Diisopropoxy dipivaloylmethanato titanium |
| | $Ti(OiPr)_4$ | Tetraisopropoxy titanium |
| Zirconium | $Zr(DPM)_4$ | Zirconium dipivaloylmethanate |
| Ruthenium | $Ru(DPM)_3$ | Ruthenium dipivaloylmethanate |

In Table I, DPM is $C_{11}H_{19}O_2$ usually called 2,2,6,6-tetramethyl-3,5-heptanedione.

During CVD-fabrication of layered superlattice materials, the vaporized metalorganic reagents should be prevented from being pyrolized or reacting with other substances prior to deposition. On the other hand, the reagents should pyrolyze rapidly and homogeneously once they reach the surface of the substrate. In order to achieve this objective, the invention provides a preferred method of depositing a Bi(bismuth)-generated layered superlattice thin film on a substrate in which a Bi-containing organic compound and a metal polyalkoxide compound are used as precursors. Compared to the compounds listed in Table 1, the decomposition temperatures of the metal polyalkoxides are higher, yet they have sufficiently high vapor pressure to form good thin films using CVD. It is preferable in the technique that the metal polyalkoxide precursor is represented by the following formula:

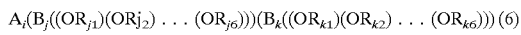

$$A_i(B_j((OR_{j1})(ORj_2) \ldots (OR_{j6})))(B_k((OR_{k1})(OR_{k2}) \ldots (OR_{k6}))) \quad (6)$$

In this formula, $A_i$ is a cationic element and at least one simple substance or a mixture selected from the group consisting of Ba, Bi, Sr, Pb, La, and Ca. Bi and B are cationic elements that are identical or different from each other, and also simple substances or mixtures selected from the group consisting of Ti, Zr, Ta, Mo, W, and Nb. $R_{j1}, R_{j2}, \ldots R_{j6}, R_{k1}, R_{k2}, \ldots R_{k6}$ are alkyl groups having carbons from 1 to 12.

The metal alkoxide compound represented by formula (6) contains two or three kinds of metal elements, and thus, a Bi-layered superlattice can be formed from the metal alkoxide compound and a Bi-containing organic compound. As a result, the number of metalorganic reagents used as precursors can be reduced to two, compared to the case of a conventional technique, which uses three precursors, one for each metal. Therefore, the process conditions can be controlled more easily, and a Bi-layered superlattice ferroelectric or high-dielectric thin film having a desired composition can be formed with good reproducibility.

The double metal alkoxide compounds are used in this invention because of the following advantages: they can be easily synthesized, separated, and refined, and they do not pyrolyze or react with other elements. Use of such compounds enables precise control of the stoichiometry of the chemical elements in the deposited layered superlattice thin film. Examples of the metal elements ($A_i$) in the metal alkoxide precursor are Group IIa elements, including Sr and Ba, Group Ia elements, including Na and K, and Pb. Examples of the metal elements ($B_j$, $B_k$) are Fe, Ti, W, and Group Va elements, including Nb and Ta. The Bi-layered superlattice ferroelectric thin film obtained possesses excellent properties, including spontaneous polarizability, as a capacitor in a nonvolatile memory, especially when the metal elements ($A_i$) are Group IIa elements, including Sr and Ba, and the metal elements ($B_j$, $B_k$) are Group Va elements, including Nb and Ta. The alkyl groups of the alkoxy groups ($OR_{j1}$, $OR_{j2}$) ... ($OR_{j6}$, $OR_{k1}$, $OR_{k2}$ ... $OR_{k6}$ in formula (6) contained in the metal oxide precursor are typically alkyl groups having carbons from 1 to 5, more specifically, methyl groups, ethyl groups, isopropyl groups, tertiary butyl groups, and isopentyl groups. The six alkyl groups that coordinate with the metal elements ($B_j$, $B_k$) can be one kind, different from each other, or be classified in from two to five of the groups mentioned in the preceding sentence. Especially when the alkyl groups in the precursor (alkyl groups that coordinate with the metal element $B_j$ and alkyl groups that coordinate with the metal element $B_k$) are either ethyl groups or isopropyl groups, vapor pressure sufficient for chemical vapor deposition of a thin film is achieved at a relatively low temperature region (at most 250° C.).

The following compounds are examples of the preferred metal double-alkoxide reagents suited for CVD deposition:

(1) $Sr(Ta(OiPr)_6)_2$
(2) $Sr(Nb(OiPr)_6)_2$
(3) $Ba(Ta(OiPr)_6)_2$
(4) $Ba(Nb(OiPr)_6)_2$
(5) $Sr(Ta(OiPr)_6)(Nb(OiPr)_6)$
(6) $Ba(Ta(OiPr)_6)(Nb(OiPr)_6)$
(7) $Sr(Ta(OiPr)_3(OEt_3)_2$
(8) $Sr(Ta(OiPr)_3(OEt_3)(Ta(OiPr)_2(OEt_4)$
(9) $Sr(Ta(OEt)_6)_2$
(10) $Sr(Nb(OEt)_6)_2$
(11) $Ba(Ta(OEt)_6)_2$
(12) $Ba(Nb(OEt)_6)_2$

In these examples, Et indicates an ethyl group and iPr indicates an isopropyl group. In this invention, one or plural kinds of metal alkoxide reagents can be used. These metal alkoxide reagents can be easily synthesized, separated, and refined. They gasify in a relatively low temperature region (130° to 230° C.) to provide a vapor pressure (at least 0.1 Torr) required in the CVD process. In addition, the reagents are stable and do not decompose while they are fed into the deposition reactor, and then they rapidly pyrolyze on the substrate, which is heated to 300°0 to 500° C.

Organic compounds containing Bi (bismuth) include trimethyl bismuth $Bi(CH_3)_3$, triethyl bismuth $Bi(C_2H_7)_3$, triphenyl bismuth, Bi-tertiary butoxide, Bi-tertiary pentoxide, and Bi-tertiary amyloxide. One or plural kinds of them can be used. Among them, Bi-tertiary butoxide and Bi-tertiary pentoxide will have a high vapor pressure in a low temperature region (at least 0.3 Torr at 100° C.). Therefore, the amount deposited onto the substrate can be controlled accurately in the CVD process.

When an organic compound containing Pb is used, the CVD-process can produce at a low temperature a Pb-containing, Bi-layered ferroelectric superlattice thin film in which the remnant polarization is enhanced. The reacting vapor comprises at least one element selected from the group consisting of Sr (strontium) and Ba (barium), and at least one element selected from the group consisting of Nb (niobium) and Ta (tantalum). In other words, this invention provides a method for producing a Pb-containing Bi-layered superlattice ferroelectric thin film (formula (7)) from a Bi-containing organic precursor, a Pb-containing organic precursor, and a polyalkoxide precursor represented by formula (8).

$$(Sr_aBa_bPb_c)(Nb_xTa_y)Bi_2O_9 \qquad (7)$$

where a+b+c=1, 0≦c≦1, x+y=2

$$(Sr_dBa_e(Nb_pTa_q)(OR)_6)_2 \qquad (8)$$

where d+e=1, p+q=1, R is $C_2H_5$ or $CH(CH_3)_2$.

In this way, the polyalkoxide precursor (double alkoxide) represented by formula (8) remains stable, not decomposing when it is misted and vaporized for transport into the deposition reactor, and it decomposes rapidly and homogeneously on the heated substrate in the deposition reactor at a temperature of between 300° and 500° C. Therefore, the Bi-layered superlattice thin film of formula (7) can grow stably.

The Pb-containing organic compounds generally used in CVD-processes can be used in this invention. Examples include: $PbMe_4$, $PbEt_4$, $PbEt(OCH_2CMe_3)$, $PbEt_3(OiPr)$, $PbEt_3(OtBu)$, $Pb(dpm)_2$, $Pb(tmhpd)_2$, $Pb(OtBu)_2$, and $Pb_4O(OtBu)_6$. Here, Me indicates a methyl group, Et is an ethyl group, iPr is an isopropyl group, tBu is a tertiary butyl group, dpm is a dipivaloymethanate, and tmhpd is 2,2,6-trimethylheptane-3,5-dionate. At least one of these compounds is used. The first five Pb-containing organic compounds listed above to which alkyl groups are directly coupled have acute toxicity. The next two compounds comprising β-diketonate can react with the alkoxide compounds (formula (6)) in the process stream leading to the deposition reactor before they assist the growth of the Bi-layered superlattice thin film. As a result, it is preferable that at least one of the latter two compounds, namely, Pb-tertiary butoxide and Pb-oxotertiary butoxide are used. Pb-tertiary butoxide is the most volatile compound among the Pb-alkoxides (it sublimates at 100° C. under vacuum) and pyrolizes partially at low temperature to change into Pboxotertiary butoxide ($Pb_4O(OtBu)_6$). Pb-oxotertiary butoxide is preferable as a CVD reagent because it is more stable to heat and less volatile. Its pyrolytic temperature is in the range from 300° to 500° C., so it will not decompose prematurely in process streams before reaching the deposition reactor. Pb-oxotertiary butoxide can be synthesized as described by R. Papiernik et al. in *Polyhedron*, vol. 14,1657 (1991).

The CVD methods used in this invention can include normal pressure CVD, vacuum CVD, plasma CVD, and optical CVD. Normal pressure CVD means that the precursors are pyrolyzed and deposited on the substrate under atmospheric pressure. In vacuum CVD, the same operation is carried out in a reduced pressure. In plasma CVD, the reagent vapor is plasma-excited to accelerate the growth reaction when the reagent vapor is pyrolyzed. In optical CVD, ultraviolet rays are irradiated to the pyrolytic atmosphere of the reagent vapor in order to accelerate the growth reaction.

In this invention, it is preferable to prepare a Bi-containing oxide liquid precursor solution and a double alkoxide liquid precursor solution separately; then, the invention provides for generating mists of the liquid precursors; the separate streams of misted precursors are mixed and vaporized (gasified) in the heating zone just before entering the deposition reactor, where the reagents decompose and form a Bi-layered superlattice thin film. By this preferred method, it is possible to control directly the stoichiometry of the atoms in the layered superlattice thin film by controlling both the relative concentrations of the precursor reagents during preparation of the solutions and the mass flow rates of the misted process streams. Each tiny droplet suspended in the mist exiting from a mist generator contains liquid with a composition identical to the composition of the liquid precursor solution entering the mist generator. The rate of misting in the mist generators can be varied and controlled accurately, so that the mass flow rate of each precursor and the stoichiometry of the deposited thin film can be controlled. The tiny mist droplets, which have a large surface to volume ratio, can be vaporized, i.e. gasified, quickly at a low temperature in the heated zone immediately prior to entering the deposition reactor. This avoids the problem of premature decomposition.

In the alternative, the invention also contemplates the preparation and misting of a single precursor solution so that layered superlattice thin films can be formed from reagents that remain stable when dissolved in a common liquid solvent. Such an alternative method would make the control of reagent mass flow rate and thin film stoichiometry even easier. The organic solvents used to make a single precursor solution include hydrocarbons, nitroparaffins, organic sulfur compounds, alcohols, phenols, aldehydes, ethers, ketones, organic acids, amines, and esters. Such solvents can be used alone or as a mixture thereof. The solvent tetrahydofuran can be used alone or in a mixture with at least one other solvent from one of the above categories in order to obtain a single liquid precursor solution because the reagents of this invention generally dissolve well in tetrahydrofuran.

In some cases, the metal elements (e.g., Sr, Ta, and Nb) supplied by the metal alkoxide compound represented by formula (6) are insufficient to achieve the desired film stoichiometry. In such a case, the metal alkoxide reagent represented by formula (6) should be used with another alkoxide containing one of the metal elements of the metal alkoxide reagent, for example, a Sr-alkoxide, Ta-alkoxide, and Nb-alkoxide. In this case, it is preferable that the alkoxy groups of the alkoxide are identical to those of the metal alkoxide reagent represented by formula (6).

It is preferable that the precursor composition comprises 1 to 99 weight percent of the Bi-containing organic compound and 99 to 1 weight percent of the metal polyalkoxide compound.

It is preferable that each $R_{j1}$, $R_{j2}$, ... $R_{j6}$, $R_{k1}$, $R_{k2}$, ... $R_{k6}$ of the metal alkoxide compound represented by formula (6) is at least one group selected from the group consisting of an ethyl group and an isopropyl group. If the respective twelve alkoxy groups of the metal alkoxide compounds comprise ethoxy or propoxy groups, vapor pressure sufficient for film-forming by CVD-technique can be obtained in a comparatively low temperature region (at most 250° C.). As a result, the amount of the compound supplied onto the substrate can be controlled more easily, and the amount of the metal elements contained in the ferroelectric thin film (excepting Bi) can be controlled more accurately.

It is preferable that $A_i$ of the alkoxide group represented by formula (6) is Sr or Ba, $B_j$ is Nb or Ta, and $B_k$ is Nb or Ta, so that the obtained Bi-layered superlattice ferroelectric thin film has excellent characteristics as a capacitance insulating film for a nonvolatile memory.

It is preferable that the Bi-containing organic compound is at least one compound selected from the group consisting of Bi-tertiary butoxide or Bi-tertiary pentoxide. Since Bi-tertiary butoxide and Bi-tertiary pentoxide have high vapor pressure in a low temperature region (0.3 Torr or more at 100° C.), the amount of the compound supplied to the substrate surface can be controlled more easily, and the amount of Bi-contained in the ferroelectric thin film can be controlled more accurately.

It is preferable to prepare a precursor solution comprising the Bi-containing organic compound and another precursor solution comprising the double metal alkoxide compound represented by formula (6) using organic solvents, and that the solutions are misted, vaporized, and injected into the deposition reactor in order to grow Bi-layered ferroelectric thin film as in formula (1) on a substrate therein. The concentration of the Bi-containing organic compound and that of the metal alkoxide compound represented by formula (6) in the precursor solutions and resulting vapor stream are controlled to obtain a desirable Bi-layered ferroelectric composition.

In the alternative embodiment of the invention in which all precursors are mixed in a single organic solvent, the solvent preferably contains tetrahydrofuran. The Bi-containing organic precursors and the metallic alkoxide precursors represented by formula (6) generally dissolve well in tetrahydorfuran, so that the precursors can be homogeneously dissolved in liquid solvent, and as a result, a more homogeneous Bi-layered ferroelectric stoichiometry can be achieved.

When lead is used in the alternative embodiment, the amount of the added Pb-containing organic precursor ranges from $1 \times 10^{-5}$ to 200 weight parts when the composition comprising the Bi-containing precursor and the metal polyalkoxide precursor is 100 weight parts.

It is preferable that the Pb-containing organic precursor is at least one compound selected from the group consisting of Pb-tertiary butoxide and Pb-oxotertiary butoxide.

It is preferable that the reactant gas is plasma-excited when the gas is being pyrolyzed on the substrate, so that the decomposition of the vaporized reagent compounds is accelerated and the film can grow at a lower temperature. In addition, the excited state of the gas can be varied, and the orientation and the quality of the ferroelectric or dielectric thin film can be controlled.

In an alternative embodiment of the invention, ultraviolet rays are irradiated to the pyrolytic atmosphere of the reactant gas in the deposition reactor, so that the decomposition of the vaporized reagents is accelerated and the film can grow at a lower temperature.

It is preferable that the substrate is a semiconductor. In the invention, it is possible to combine Bi-layered superlattice ferroelectric thin-film forming steps in the process of producing an integrated circuit, and devices such as a nonvolatile memory can be produced efficiently.

In an alternative embodiment of the invention, at least one solid precursor is sublimed to form a vapor of the reagent, and this vapor is subsequently mixed with other vaporized reagents produced by misting liquid precursors.

EXAMPLE 1

As an example of the process of the invention, a substrate 717 is prepared at 650° C. in a diffusion furnace for 30 minutes with an oxygen flow of 6 liters/min.

Then a thin film 60 of strontium bismuth tantalate ($SrBi_2Ta_2O_9$) is prepared using a 0.4 molar solution of Bi-tertiary butoxide in tetrahydrofuran as the bismuth precursor, $Pr_A$ in FIG. 3, and a 0.4 molar solution of strontium tantalum ethoxide, $Sr[Ta(OEt_6)]_2$, in tetrahydrofuran as the strontium-antalum alkoxide precursor, $Pr_B$ in FIG. 3. The two liquid precursors are fed to a mixing manifold 101, each at a liquid flow rate of 150 micro cubic centimeters minute. The combined precursor mixture is fed to mist generator 114, which operates at ambient temperature to create a mist. The flow rate of a nitrogen carrier gas to mist generator 14 is 1.5 liter/min. The misted precursor in the carrier gas flows through tubing 148 at ambient temperature to heated vaporization zone 124, where it is gasified at a pressure of 10 milliTorr and a temperature of 150° C. The vaporized precursors and carrier gas flow into mixer 128, where they are mixed with oxygen gas. Reagent oxygen is fed into mixer 128 at a flow rate of about 1.5 liter/min. The reactant gas mixture containing the oxygen, carrier gas and vaporized precursors flows through the shower head injector 130 into the deposition reactor 129. The deposition reactor is a cold-wall reactor (not heated). It is operated at 10 milliTorr pressure. The substrate 717 is a platinum-coated Si-wafer. It is heated to a temperature of about 500° C. by the substrate heater 132, at which temperature decomposition of the reagents by pyrolysis and deposition of a thin film on the substrate occurs. The decomposition reaction is enhanced by plasma excitation. Plasma generator 136 is operated at about 100° C. The chemical deposition reaction is completed in about 10 minutes. An anneal step 632 at a temperature of 750° C. in an oxygen flow of about 6 l/min for 30 minutes a strontium bismuth tantalate ($SrBi_2Ta_2O_9$) film of good electrical properties with a final thickness of 1400 Å may be formed.

The deposition reactor is a conventional, cold-walled PE-MOCVD reactor. It is a feature of the invention that after depositing by CVD, the layered superlattice material is treated to crystallize it in a phase including more grains with a high polarizability orientation than prior to said step of treating. Here, a "high polarizability orientation" means that the grains are oriented in such a way that a field normal to the surface of the substrate will produce a higher polarizability than if the treatment had not been performed. As indicated above, the treatment may comprise, RTP, oxygen furnace annealing, ion implantation, a second anneal after the contact to the layered superlattice material is formed, or combinations thereof.

There has been described a CVD process for making thin films of active elements in integrated circuits, particularly elements utilizing layered superlattice materials. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that the importance of gasifying the mist at relatively low temperatures prior to reaction of the gases has been disclosed, this inventive feature may be used in combination with many other CVD processes than those there is room to described herein. It is also evident that the steps recited may in some instances be performed in a different order. Or equivalent structures and process may be substituted for the various structures and processes described. Or a variety of different precursors may be used. Consequently, the invention is to be construed as embracing each and every novel feature and novel combination of features present in and/or possessed by the fabrication processes, electronic devices, and electronic device manufacturing methods described.

We claim:

1. A method of fabricating an integrated circuit including a thin film, said method comprising steps of:

(a) providing at least one liquid precursor;

(b) forming a mist of said at least one liquid precursor;

(c) gasifying said mist to form a gasified precursor comprising amounts of a bismuth-containing organic compound, a metal polyalkoxide compound, and a lead-containing organic compound without breaking the chemical bonds of said compounds;

(d) transporting said gasified precursor to a deposition reactor using at least one carrier gas;

(e) flowing oxygen gas into said deposition reactor;

(f) mixing said gasified precursor, said at least one carrier gas and said oxygen gas to form a reactant gas in said deposition reactor;

(g) providing a substrate in a deposition reactor; and (h) reacting said reactant gas in said deposition reactor to form said thin film on said substrate, wherein said thin film comprises a layered superlattice material represented by a formula of:

$$(Sr_aBa_bPb_c)(Nb_xTa_y)Bi_2O_9$$

where a+b+c=1, $0 \leq c \leq 1$, x+y=2.

2. A method of fabricating an integrated circuit including a thin film of a compound containing at least two metals, said method comprising steps of:

(a) providing: a liquid precursor suitable for forming said compound; and a deposition reactor containing a substrate; said liquid precursor comprising at least one metal polyalkoxide compound containing said at least two metals, said at least two metals selected from the group consisting of strontium, calcium, barium, cadmium, lead, tantalum, hafnium, tungsten, niobium, zirconium, bismuth, scandium, yttrium, lanthanum, antimony, chromium, molybdenum, vanadium, ruthenium and thallium;

(b) forming a mist of said liquid precursor using a venturi mister;

(c) gasifying said mist to form a gasified precursor;

(d) flowing said gasified precursor into said deposition reactor;

(e) reacting said gasified precursor in said deposition reactor to form said thin film of said complex compound on said substrate; and (f) completing said integrated circuit to include at least a portion of said thin film in an active component of said integrated circuit.

3. A method as in claim 2 wherein said step of forming a mist of said liquid precursor using a venturi mister comprises flowing a gas across an open throat of a tube containing said liquid precursor, with the flow of said gas being substantially parallel to said open throat.

4. A method as in claim 3 wherein said tube is a capillary tube.

5. A method as in claim 2 and further including a step of flowing oxygen gas into said deposition reactor prior to said step of reacting.

6. A method as in claim 2 and further including a step of mixing said gasified precursor with oxygen gas prior to said step of reacting.

7. A method as in claim 2 wherein said liquid precursor includes a metal compound including at least one of said metals, and wherein said step of gasifying comprises gasifying said liquid precursor without breaking the chemical bonds of said metal compound.

8. A method as in claim 2 wherein said compound comprises a layered superlattice material.

9. A method as in claim 2 wherein said layered superlattice material contains a superlattice generator element selected from the group consisting of bismuth, yttrium, scandium, lanthanum, antimony, chromium, and thallium.

10. A method as in claim 2 wherein said liquid precursor comprises a bismuth-containing organic compound selected from the group consisting of trimethyl bismuth ($Bi(CH_3)_3$), triethyl bismuth ($Bi(C_2H_7)_3$), triphenyl bismuth, Bi-tertiary butoxide, Bi-tertiary pentoxide, and Bi-tertiary amyloxide.

11. A method as in claim 2 wherein said at least one metal polyalkoxide compound comprises chemical elements in proportions represented by a formula of:

$$(Sr_dBa_e)((Nb_pTa_q)(OR_6)_2$$

where d+e=1, p+q=1, R is $C_2H_5$ or $CH(CH_3)_2$.

12. A method as in claim 8 wherein said layered superlattice material is a material represented by a formula of:

$$(Sr_aBa_bPb_c)(Nb_xTa_y)Bi_2O_9$$

where a+b+c=1, $0 \leq c \leq 1$, x+y=2.

13. A method as in claim 2 wherein said step of gasifying comprises heating at a temperature at which said metal polyalkoxide compound does not decompose.

14. A method as in claim 13 wherein said temperature is below 300° C.

15. A method as in claim 13 wherein said temperature is below 200° C.

16. A method as in claim 2 further comprising at least one step of treating said thin film at temperatures of from 400° C. to 900° C. to crystallize said thin film in a phase including more grains with a high polarizability orientation than prior to said at least one step of treating, whereby said at least one step of treating is RTP, oxygen furnace annealing or a second anneal after an electrode or other contact to the thin film is formed.

17. A method as in claim 2 wherein said step of reacting includes a step of plasma-exciting said gasified precursor in said deposition reactor.

18. A method as in claim 2 wherein said step of reacting comprises a step of heating said substrate to a temperature between 300° C. and 600° C.

19. A method as in claim 2 and further including a step of prebaking said substrate prior to said step of reacting.

20. A method as in claim 2 wherein said step of completing comprises forming an electrode on said thin film.

21. A method as in claim 2 wherein said step of flowing comprises flowing said gasified precursor through a showerhead injector into said deposition reactor.

22. A method of fabricating an integrated circuit including a thin film of a compound containing at least two metals, said method comprising steps of:

(a) providing: a liquid precursor suitable for forming said compound; and a deposition system comprising a first chamber, a deposition chamber containing a substrate, and a showerhead separating said first chamber and said deposition chamber;

wherein said liquid precursor comprises at least one metal polyalkoxide compound containing said at least two metals, said at least two metals selected from the group consisting of strontium, calcium, barium, cadmium, lead, tantalum, hafnium, tungsten, niobium, zirconium, bismuth, scandium, yttrium, lanthanum, antimony, chromium, molybdenum, vanadium, ruthenium and thallium;

(b) forming a mist of said liquid precursor;

(c) gasifying said mist to form a gasified precursor;

(d) flowing said gasified precursor through said showerhead into said deposition reactor;

(e) reacting said gasified precursor in said deposition reactor to form said thin film on said substrate; and (f) completing said integrated circuit to include at least a portion of said thin film of said layered superlattice material compound in an active component of said integrated circuit.

23. A method as in claim 22 and wherein said step of gasifying takes place in said first chamber.

24. A method as in claim 22 and wherein said step of gasifying takes place outside of said first chamber and further including a step of transporting said gasified precursor to said first chamber.

25. A method as in claim 22 and further including a step of mixing said gasified precursor with oxygen.

26. A method as in claim 25 wherein said step of mixing takes place in said first chamber.

27. A method as in claim 22 wherein said step of gasifying comprises gasifying said mist without breaking the chemical bonds of said metal polyalkoxide compound.

28. A method as in claim 22 wherein said compound comprises a layered superlattice material.

29. A method as in claim 22 wherein said at least one metal polyalkoxide compound comprises chemical elements in proportions represented by a formula of:

$$(Sr_d Ba_e)((Nb_p Ta_q)(OR)_6)_2$$

where $d+e=1$, $p+q=1$, R is $C_2H_5$ or $CH(CH_3)_2$.

30. A method of fabricating an integrated circuit including a thin film of a compound containing at least two metals, said method comprising steps of:

(a) providing a plurality of liquid precursors each containing a metal compound containing at least one of said two metals, wherein said at least two metals are selected from the group consisting of strontium, calcium, barium, cadmium, lead, tantalum, hafnium, tungsten, niobium, zirconium, bismuth, scandium, yttrium, lanthanum, antimony, chromium, molybdenum, vanadium, ruthenium and thallium;

(b) forming a mist of each of said liquid precursors;

(c) mixing said mists to create a combined mist;

(d) gasifying said combined mist to form a gasified precursor;

(e) transporting said gasified precursor to a deposition reactor using at least one carrier gas; and (f) reacting said gasified precursor in said deposition reactor to form said thin film on said substrate; and (i) completing said integrated circuit to include at least a portion of said thin film of said compound in an active component of said integrated circuit.

31. A method of fabricating an integrated circuit including a thin film of a compound containing at least two metals, said method comprising steps of:

(a) providing a plurality of liquid precursors suitable for forming said compound; and a deposition reactor containing a substrate wherein said at least two metals are contained in said liquid precursors and selected from the group consisting of strontium, calcium, barium, cadmium, lead, tantalum, hafnium, tungsten, niobium, zirconium, bismuth, scandium, yttrium, lanthanum, antimony, chromium, molybdenum, vanadium, ruthenium and thallium;

(b) flowing said liquid precursors at controlled flow rates to a mixer;

(c) mixing said liquid precursors to form a combined liquid precursor just prior to forming a mist;

(d) forming a mist of said combined liquid precursor;

(e) gasifying said mist to form a gasified precursor;

(f) flowing said gasified precursor into said deposition reactor; and (g) reacting said gasified precursor in said deposition reactor to form said thin film of said compound on said substrate.

* * * * *